(12) United States Patent
Simoyama

(10) Patent No.: US 11,837,676 B2
(45) Date of Patent: Dec. 5, 2023

(54) OPTICAL SEMICONDUCTOR DEVICE AND OPTICAL TRANSMISSION APPARATUS

(71) Applicant: FUJITSU OPTICAL COMPONENTS LIMITED, Kawasaki (JP)

(72) Inventor: Takasi Simoyama, Zama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 161 days.

(21) Appl. No.: 16/832,713

(22) Filed: Mar. 27, 2020

(65) Prior Publication Data

US 2020/0321486 A1 Oct. 8, 2020

(30) Foreign Application Priority Data

Apr. 5, 2019 (JP) ................. 2019-072893

(51) Int. Cl.
*H01L 31/105* (2006.01)
*H01L 27/144* (2006.01)
(Continued)

(52) U.S. Cl.
CPC ........ *H01L 31/105* (2013.01); *H01L 27/1443* (2013.01); *H01L 31/028* (2013.01);
(Continued)

(58) Field of Classification Search
CPC ............... H01L 31/105; H01L 27/1443; H01L 31/022408; H01L 31/02327; H01L 31/028; H01L 31/0312; H01L 31/109; H01L 31/1808; H01L 31/1812; H01L 31/0352; H01L 31/035281; G02B 6/12004; G02B 6/34
See application file for complete search history.

(56) References Cited

U.S. PATENT DOCUMENTS 7,340,709 B1 3/2008 Masini et al.
7,397,101 B1 * 7/2008 Masini ................. G02B 6/4295
257/656
(Continued)

FOREIGN PATENT DOCUMENTS

CN 105576072 5/2016
JP H09-275224 A 10/1997
(Continued)

OTHER PUBLICATIONS

Office Action, dated Nov. 15, 2022, in Japanese Patent Application No. 2019-072893 (14 pp.).
(Continued)

*Primary Examiner* — David Vu
(74) *Attorney, Agent, or Firm* — STAAS & HALSEY LLP

(57) ABSTRACT

An apparatus includes a first semiconductor layer including a first bandgap; and a second semiconductor layer of a first polarity including a second bandgap smaller than the first bandgap and formed over the first semiconductor layer. The first semiconductor layer includes a first conductive region of the first polarity, a second conductive region of a second polarity, and a non-conductive region between the first conductive region and the second conductive region, and the second semiconductor layer is in contact with the first conductive region and the non-conductive region.

17 Claims, 43 Drawing Sheets

(51) Int. Cl.
  *H01L 31/0232* (2014.01)
  *H01L 31/0224* (2006.01)
  *H01L 31/028* (2006.01)
  *H01L 31/18* (2006.01)
  *H01L 31/109* (2006.01)
  *H01L 31/0312* (2006.01)

(52) U.S. Cl.
  CPC .............. *H01L 31/02327* (2013.01); *H01L 31/022408* (2013.01); *H01L 31/0312* (2013.01); *H01L 31/109* (2013.01); *H01L 31/1808* (2013.01); *H01L 31/1812* (2013.01)

(56) References Cited

U.S. PATENT DOCUMENTS

| | | | |
|---|---|---|---|
| 2009/0050891 A1 | 2/2009 | Katoh | |
| 2013/0092980 A1* | 4/2013 | Na | G02B 6/12004 257/E31.037 |
| 2013/0313579 A1* | 11/2013 | Kouvetakis | H01L 29/12 420/556 |
| 2017/0104109 A1* | 4/2017 | Simoyama | H01L 31/028 |
| 2018/0138350 A1 | 5/2018 | Nada et al. | |
| 2019/0229227 A1* | 7/2019 | Samani | H01L 31/105 |

FOREIGN PATENT DOCUMENTS

| | | |
|---|---|---|
| JP | 2003-332612 A | 11/2003 |
| JP | 2016-66682 A | 4/2016 |
| JP | 2017-147352 | 8/2017 |
| JP | 2018-129483 | 8/2018 |
| WO | WO2006/129428 | 12/2006 |
| WO | 2016/190346 A1 | 12/2016 |

OTHER PUBLICATIONS

Japanese Office Action dated Apr. 25, 2023 for Japanese Application No. 2019-072893.

Office Action dated Aug. 29, 2023 in Japanese Patent Application No. 2019-072893.

Japanese Office Action dated Sep. 5, 2023 in Japanese Application No. 2019-072893.

* cited by examiner

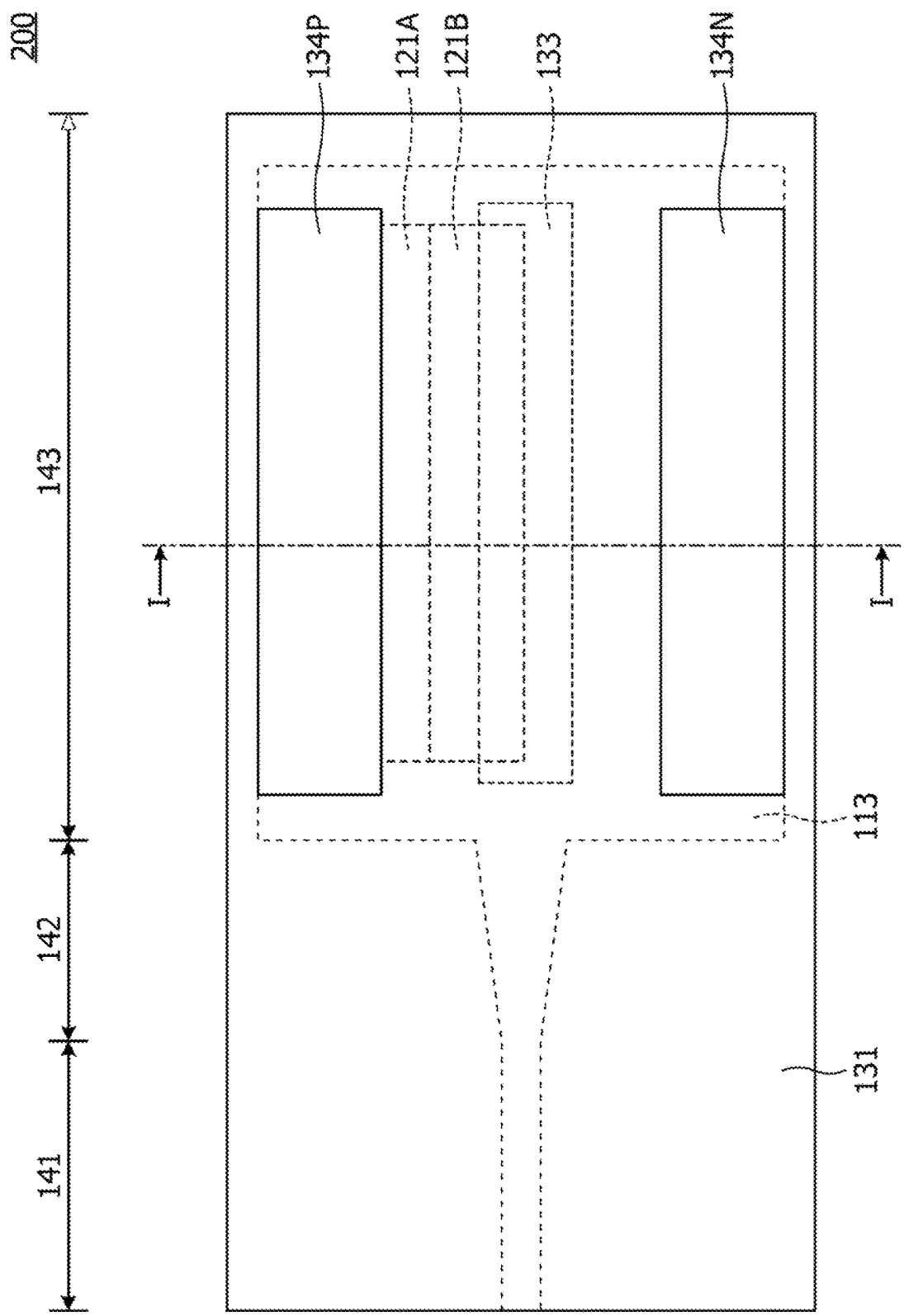

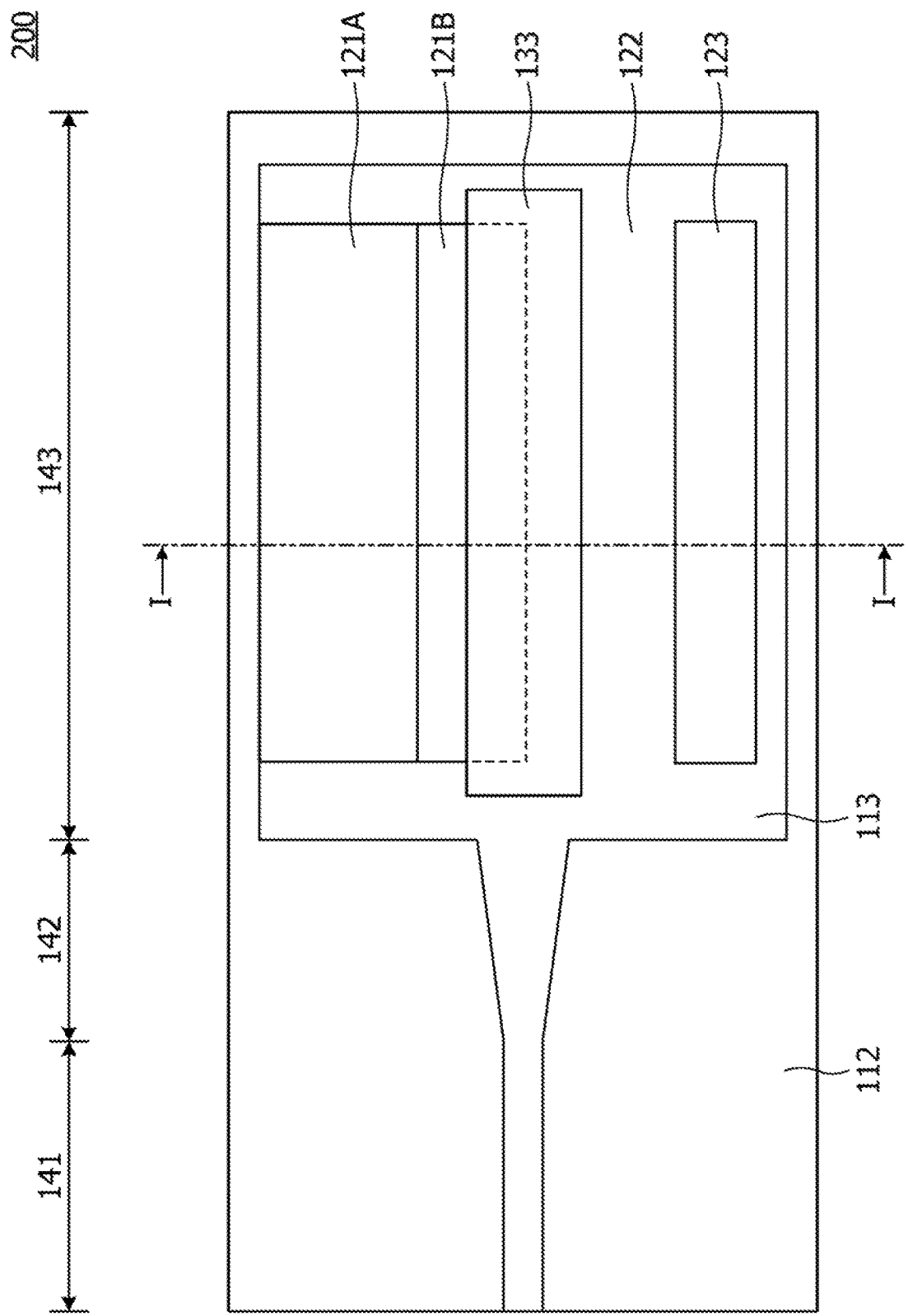

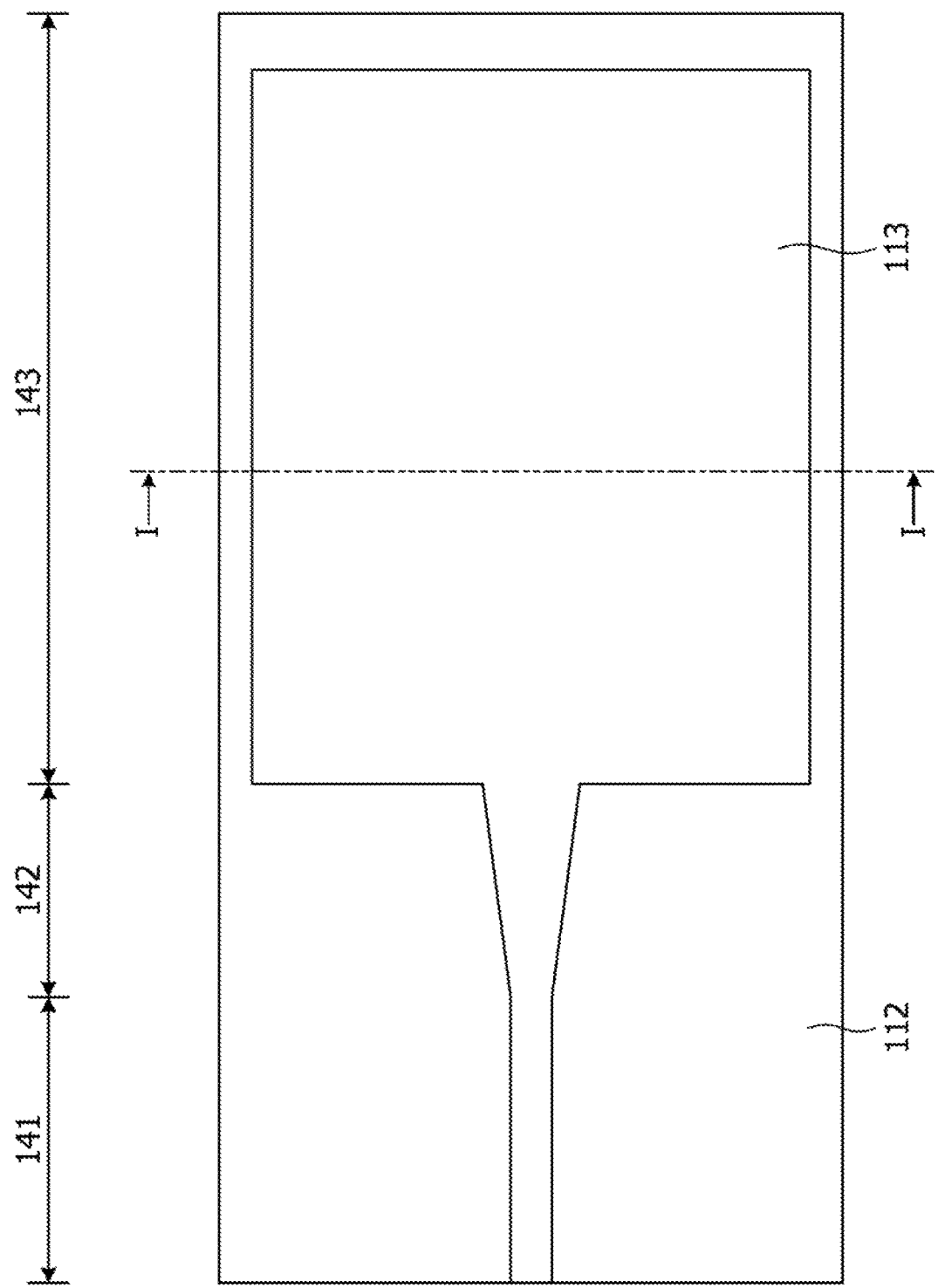

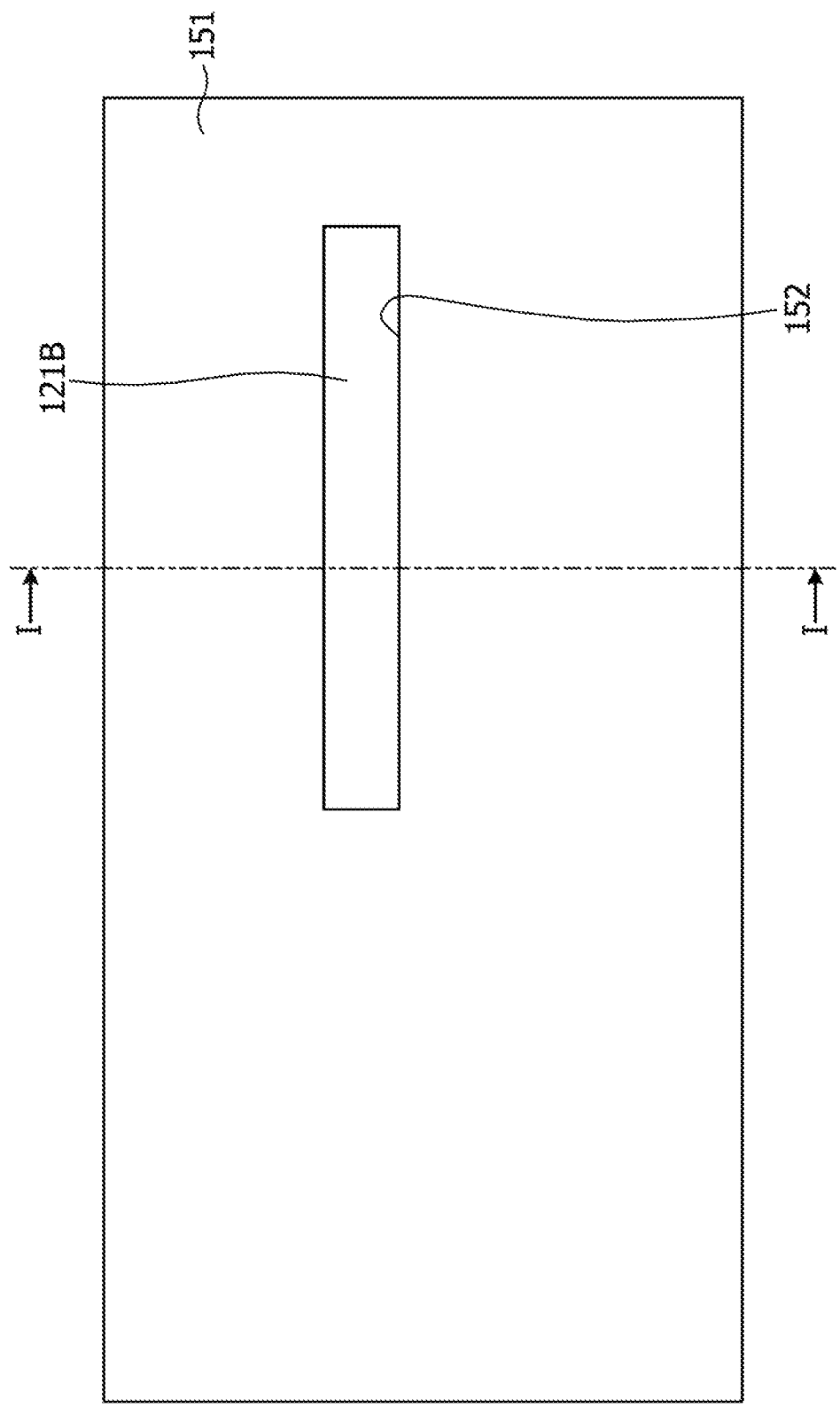

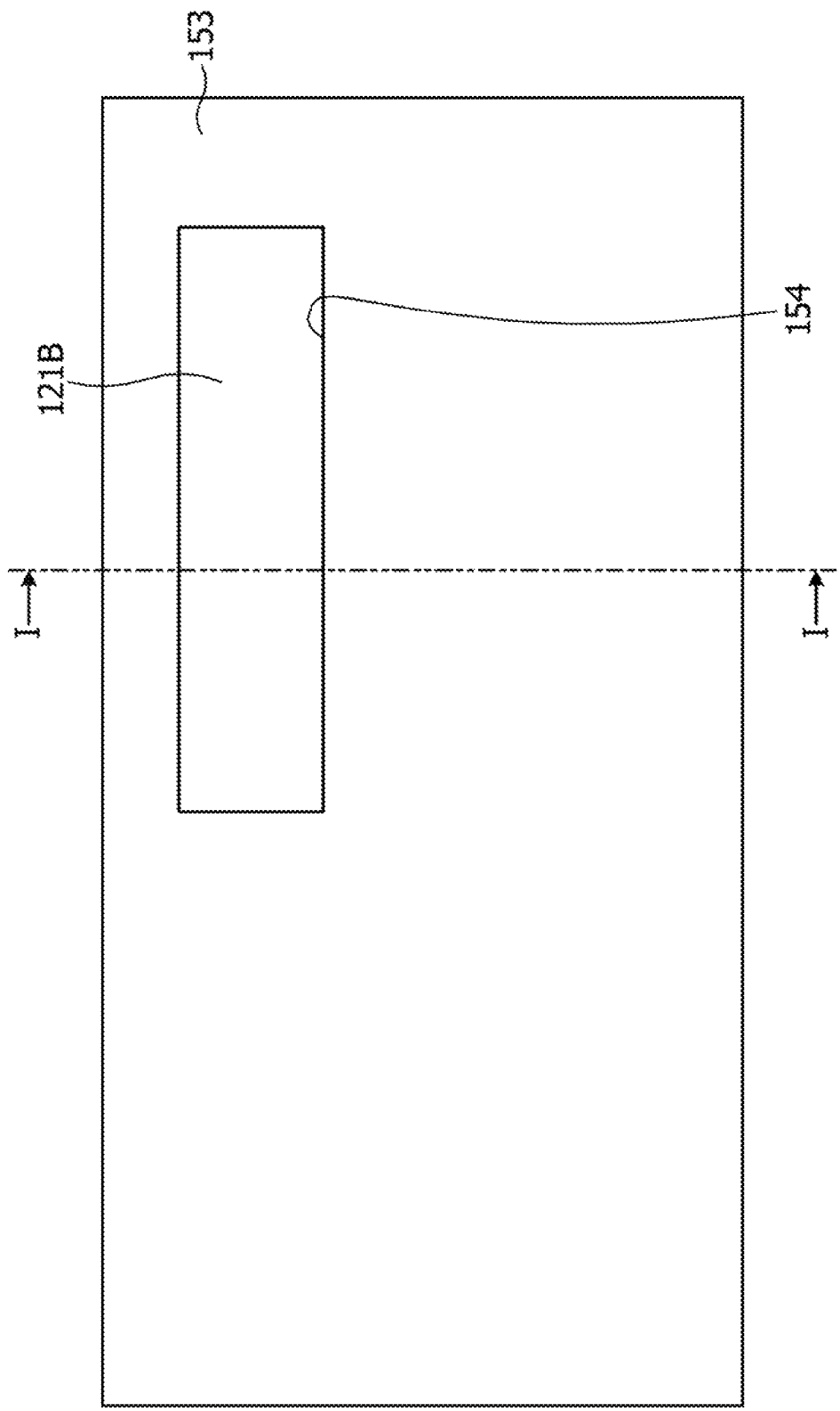

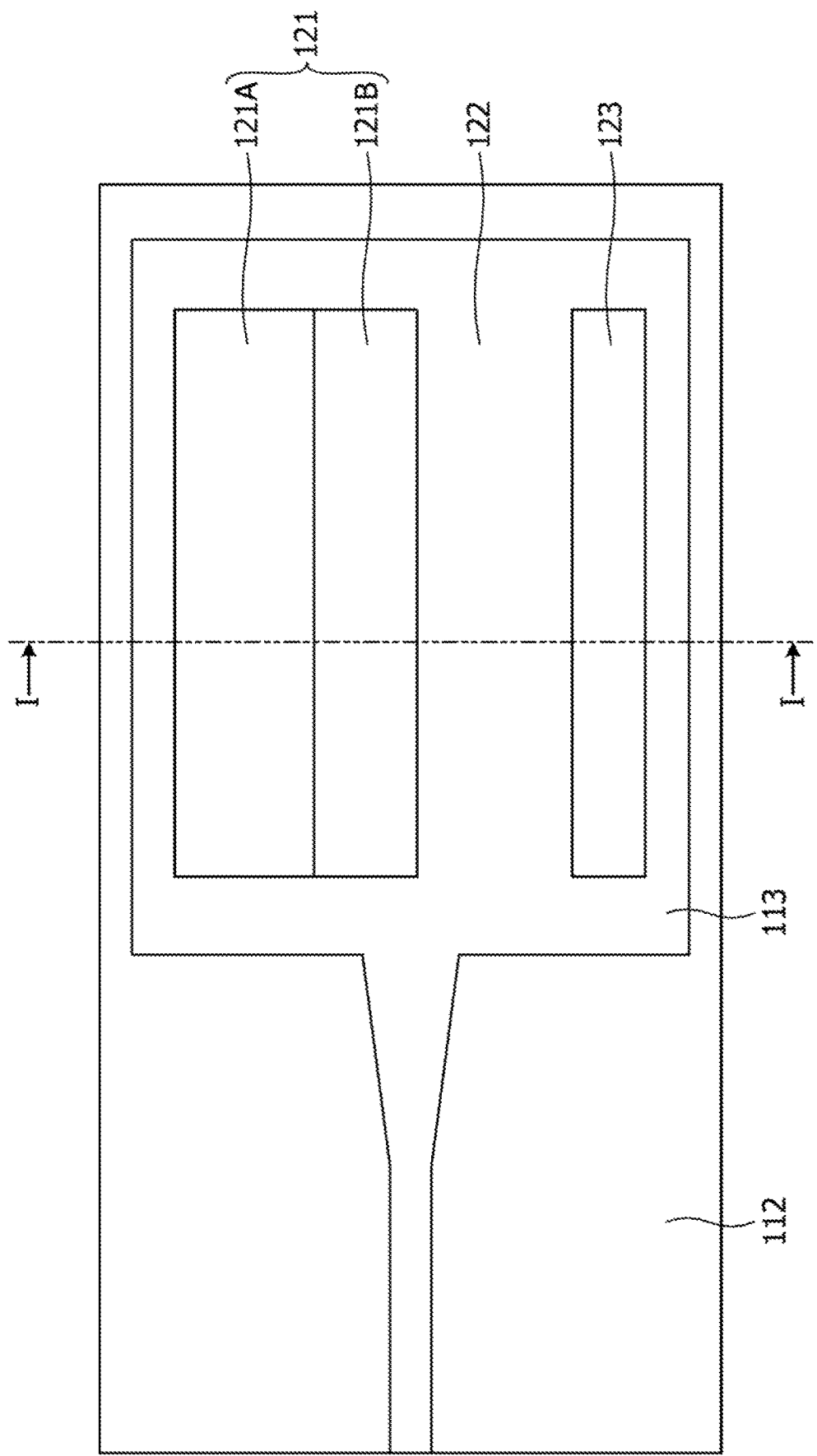

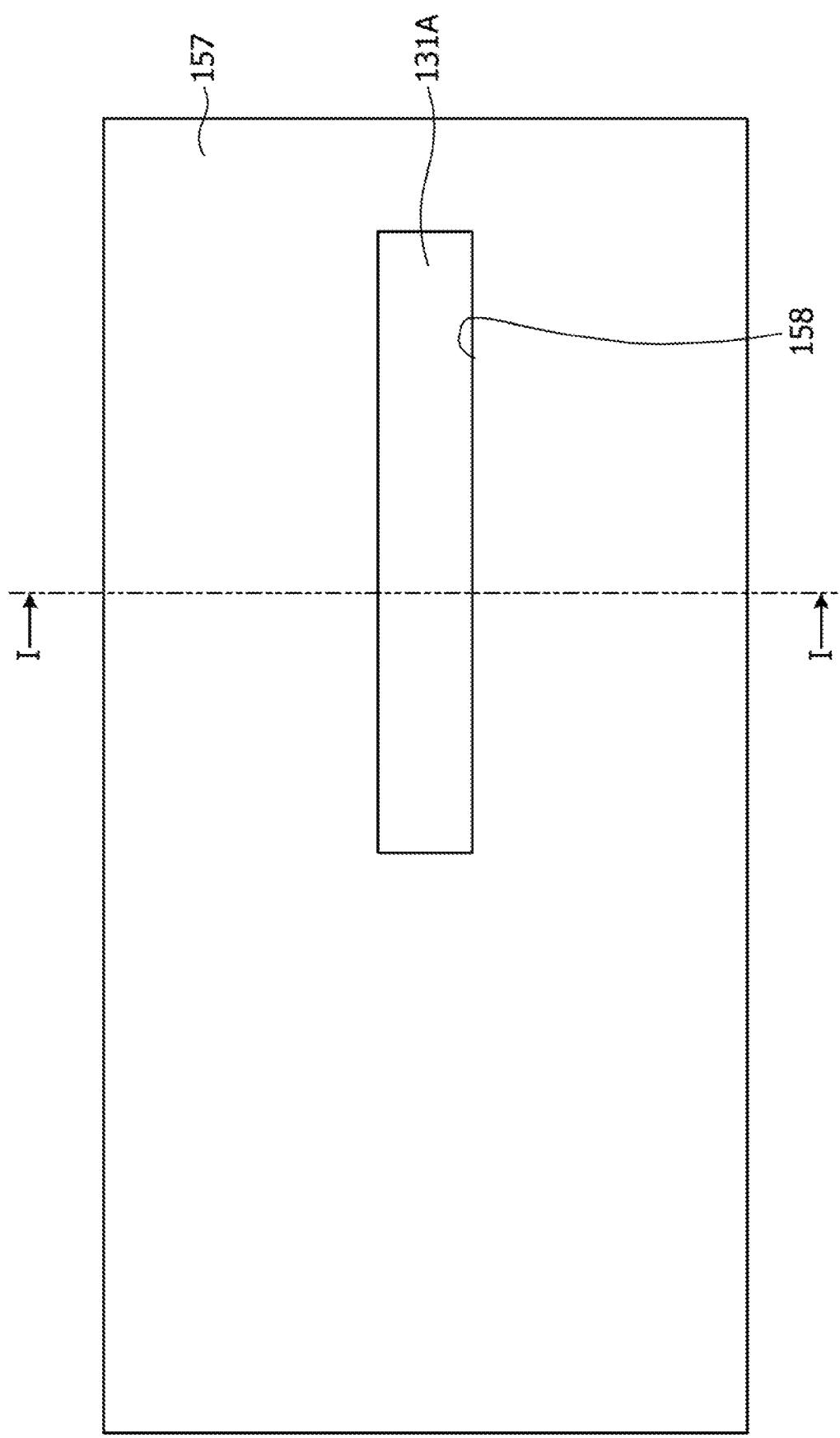

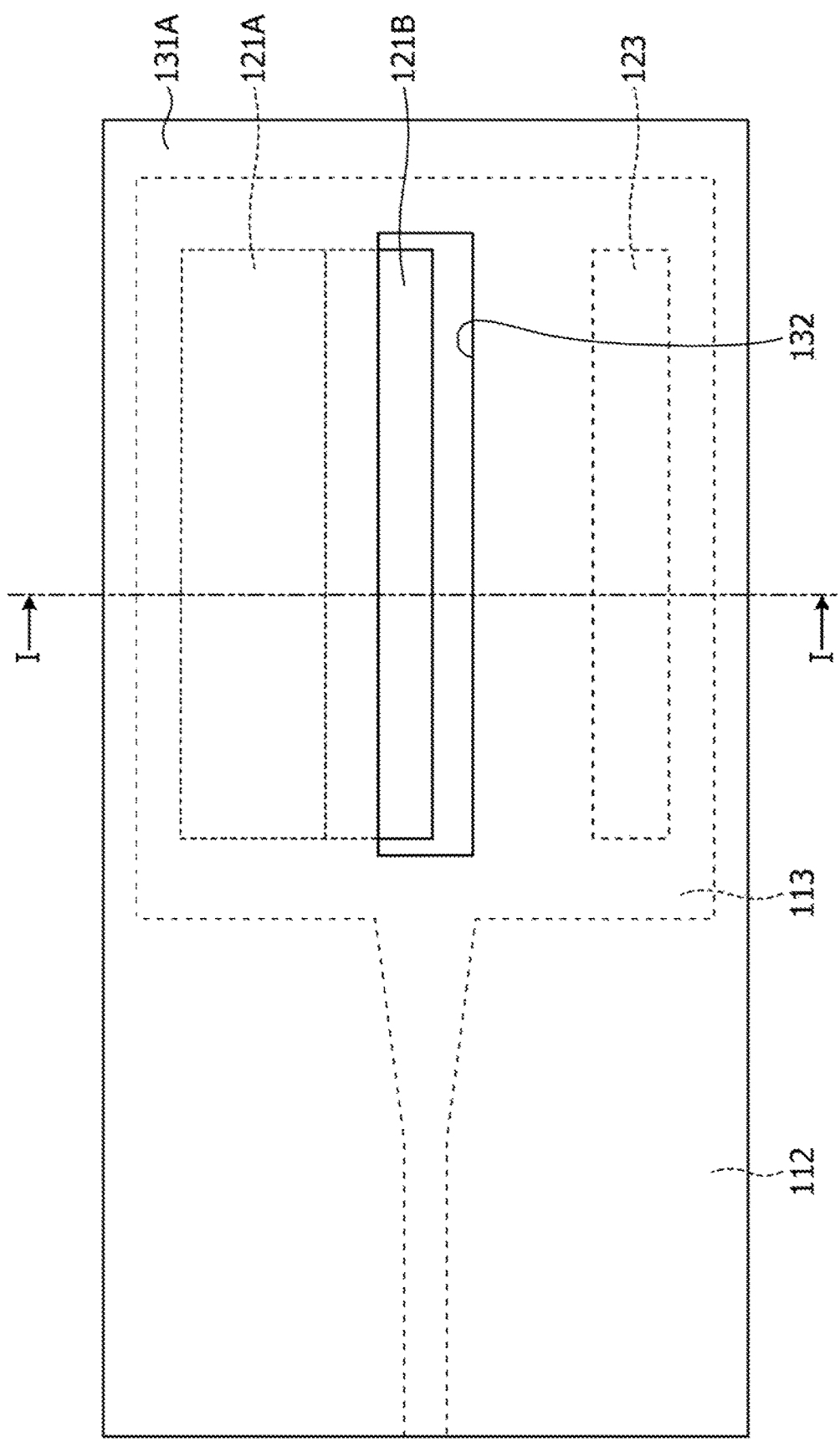

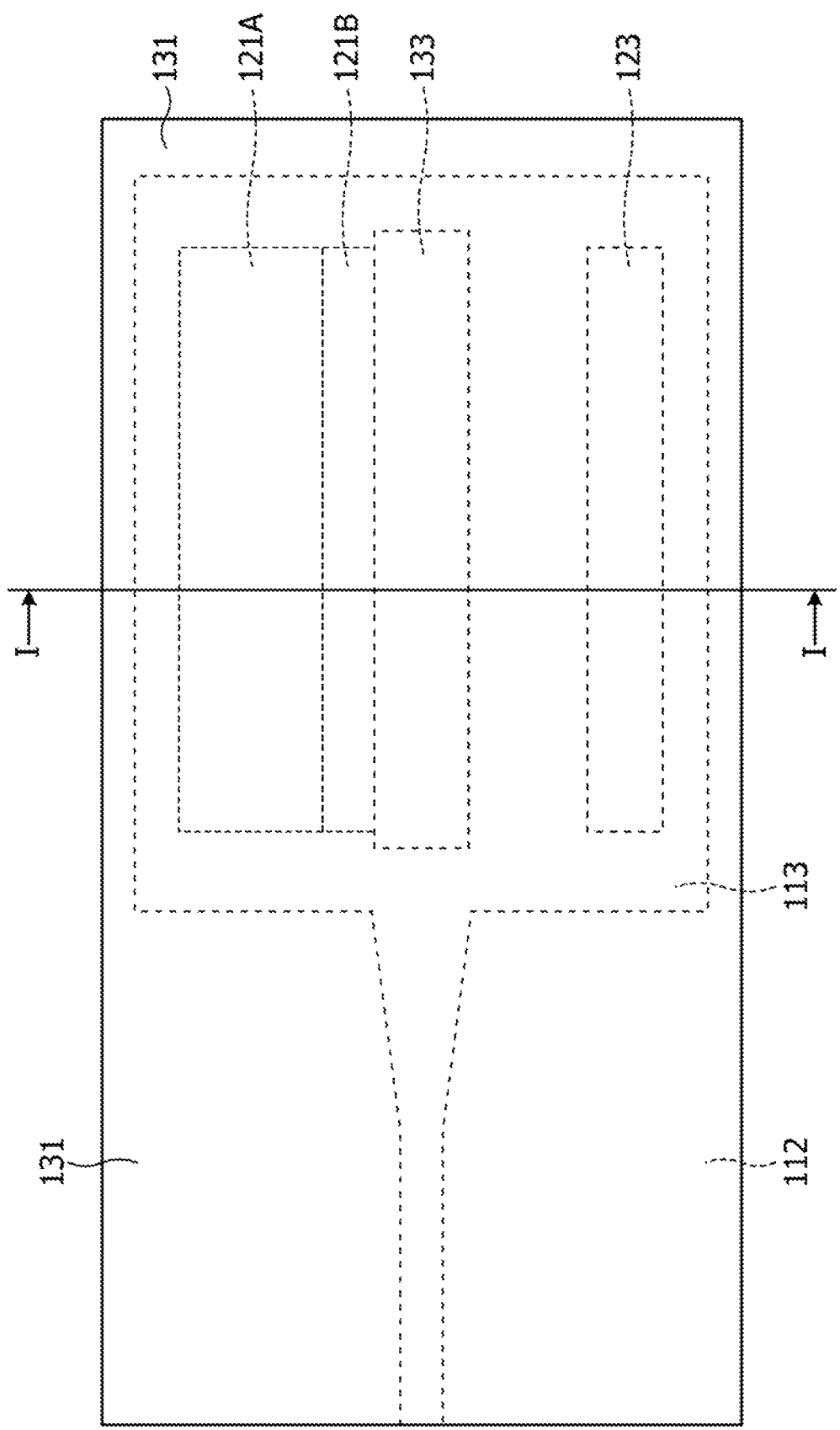

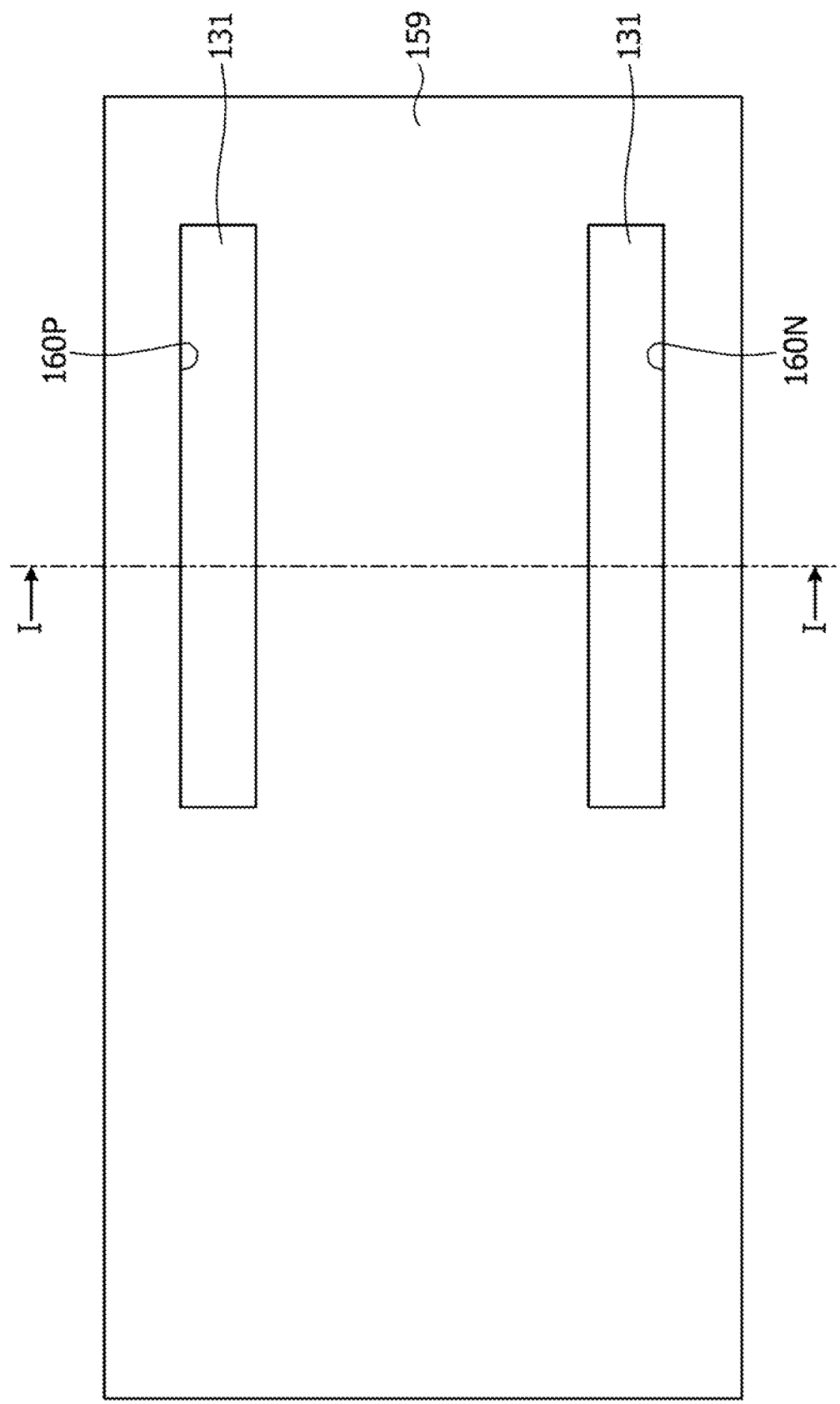

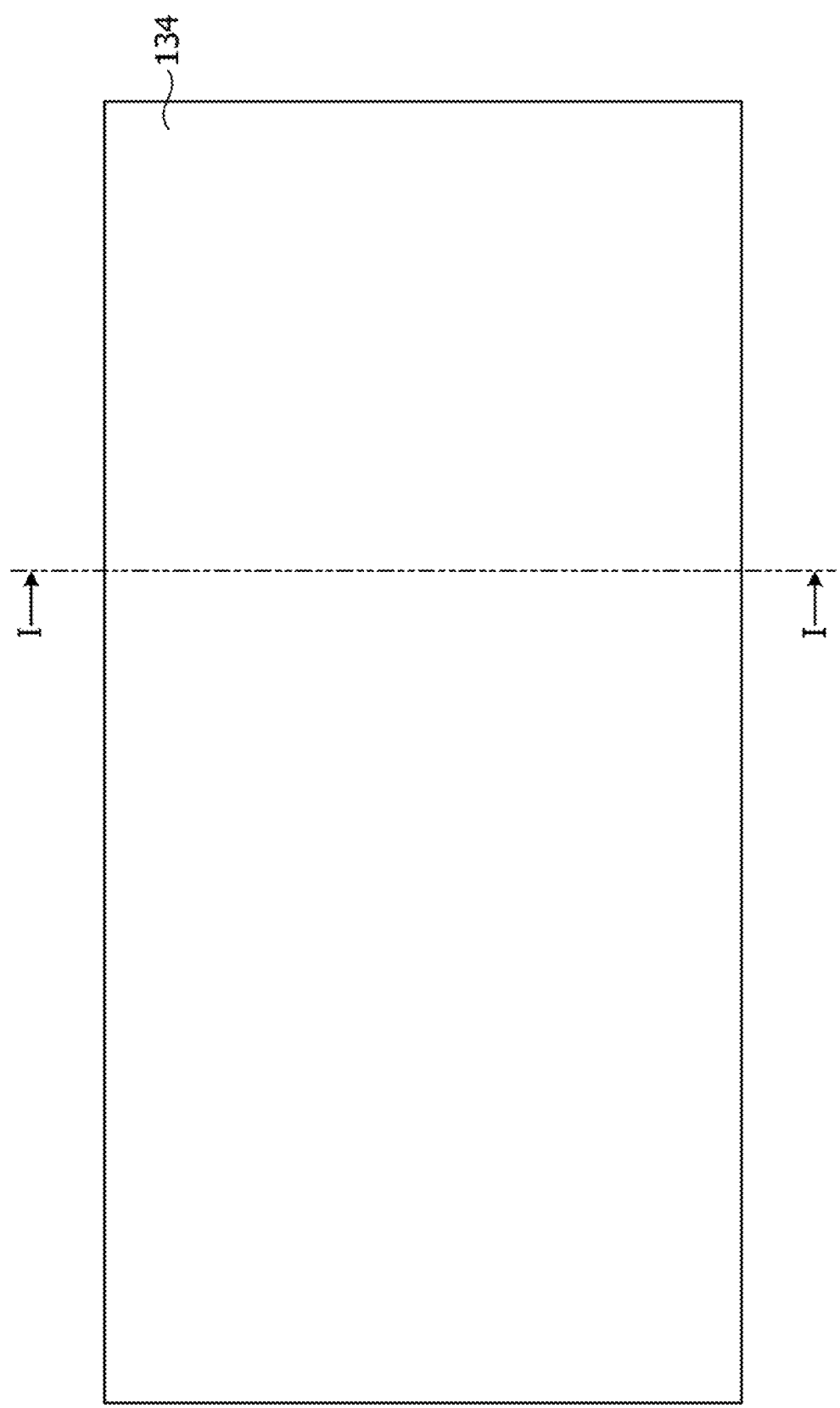

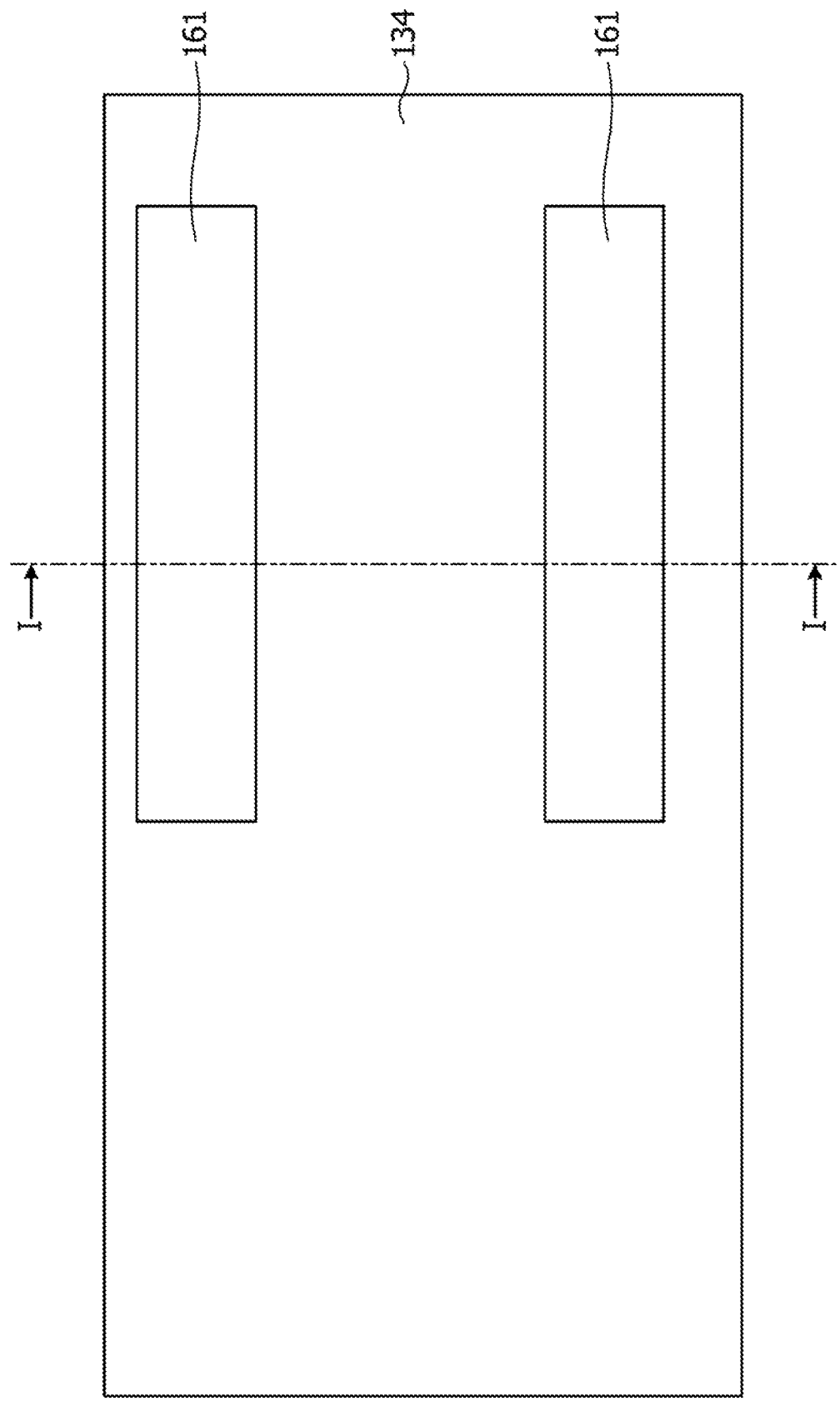

OPTICAL SEMICONDUCTOR DEVICE AND OPTICAL TRANSMISSION APPARATUS

CROSS-REFERENCE TO RELATED APPLICATION

This application is based upon and claims the benefit of priority of the prior Japanese Patent Application No. 2019-72893, filed on Apr. 5, 2019, the entire contents of which are incorporated herein by reference.

FIELD

The embodiments discussed herein are related to an optical semiconductor device and an optical transmission apparatus.

BACKGROUND

As a demand for processing performance of a computer increases, a data transmission and reception bandwidth is desired to be enlarged. There is a limit in high speed data transmission in electric signals, so an application of optical data transmission is important. In order to convert an optical signal into an electric signal with high efficiency, it is effective to integrate optical components into electrical components so as to reduce the signal loss. In recent years, research and development of a field called as Si photonics in which various optical components are provided over a silicon (Si) substrate have been attracting attention.

By this time, various optical semiconductor devices are proposed for Si photonics. For example, a single traveling carrier type photo diode is proposed for the purpose of improving a high-speed response characteristic. Meanwhile, a sufficient optical responsivity may not be obtained.

Examples of the related art include International Publication Pamphlet No. WO 2016/190346, Japanese Laid-open Patent Publication No. 9-275224, and Japanese Laid-open Patent Publication No. 2003-332612.

SUMMARY

According to an aspect of the embodiments, an apparatus includes a first semiconductor layer including a first bandgap; and a second semiconductor layer of a first polarity including a second bandgap smaller than the first bandgap, and formed over the first semiconductor layer, wherein the first semiconductor layer includes a first conductive region of the first polarity, a second conductive region of a second polarity, and a non-conductive region between the first conductive region and the second conductive region, and the second semiconductor layer is in contact with the first conductive region and the non-conductive region.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5A is a top view illustrating a configuration of an optical semiconductor device according to a second embodiment;

FIG. 5B is a diagram illustrating a layout of a semiconductor region in the optical semiconductor device according to the second embodiment;

FIG. 6A is a top view (No. 1) illustrating a method of manufacturing the optical semiconductor device according to the second embodiment;

FIG. 7A is a top view (No. 2) illustrating the method of manufacturing the optical semiconductor device according to the second embodiment;

FIG. 8A is a top view (No. 3) illustrating the method of manufacturing the optical semiconductor device according to the second embodiment;

FIG. 10A is a top view (No. 5) illustrating the method of manufacturing the optical semiconductor device according to the second embodiment;

FIG. 11A is a top view (No. 6) illustrating the method of manufacturing the optical semiconductor device according to the second embodiment;

FIG. 12A is a top view (No. 7) illustrating the method of manufacturing the optical semiconductor device according to the second embodiment;

FIG. 14A is a top view (No. 9) illustrating the method of manufacturing the optical semiconductor device according to the second embodiment;

FIG. 15A is a top view (No. 10) illustrating the method of manufacturing the optical semiconductor device according to the second embodiment;

FIG. 17A is a top view (No. 12) illustrating the method of manufacturing the optical semiconductor device according to the second embodiment;

FIG. 18A is a top view (No. 13) illustrating the method of manufacturing the optical semiconductor device according to the second embodiment;

DESCRIPTION OF EMBODIMENTS

Figure 1:
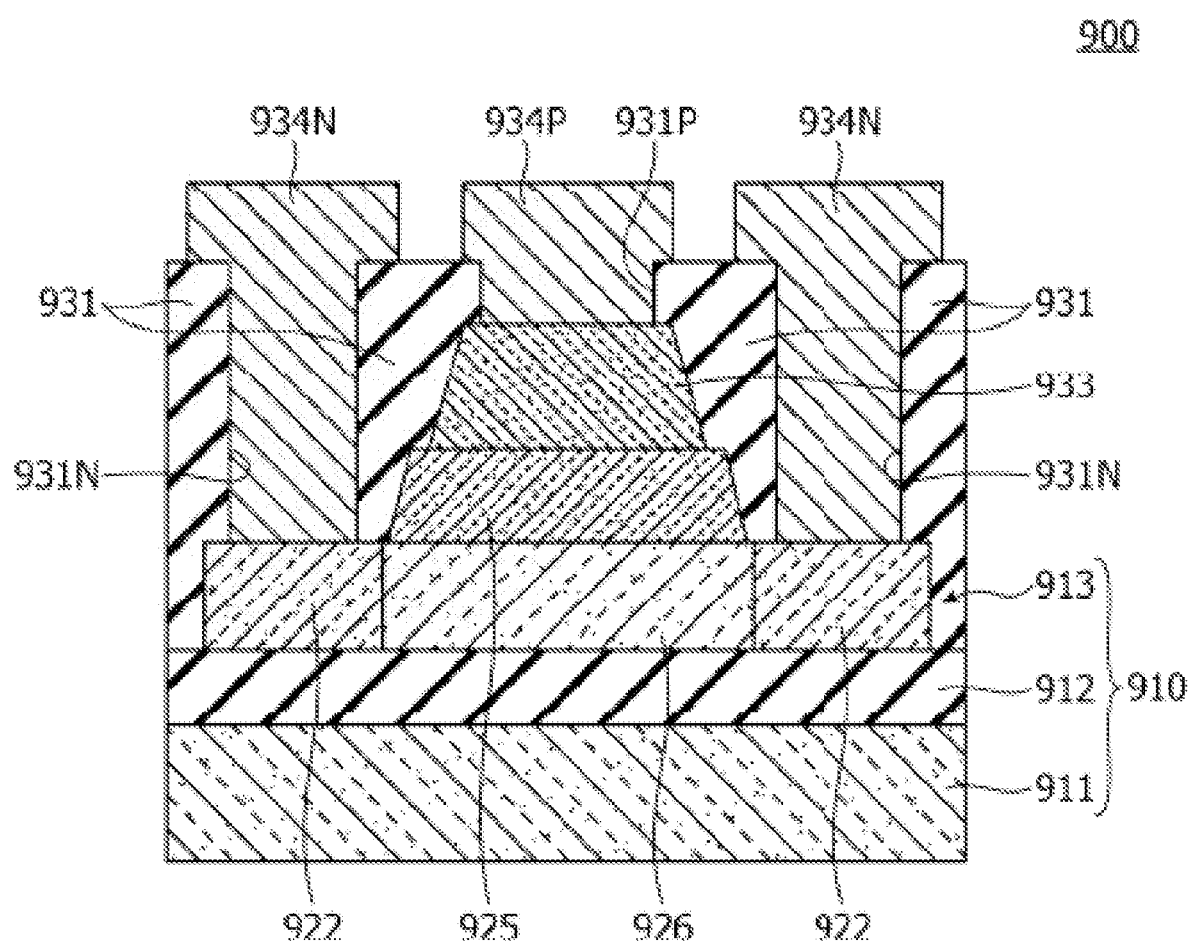
FIG. 1 is a cross-sectional view illustrating a configuration of an optical semiconductor device according to a reference example.

In a portion of an optical component which performs a process such as demultiplexing or modulation of light, a characteristic of optical transparency is significant to avoid an excessive loss. On the other hand, a light receiver for converting an optical signal into an electric signal (O/E conversion) is significant to have a characteristic of absorbing light. As candidates of materials satisfying these requests, a combination of a near-infrared light having a wavelength of 1.2 μm to 1.6 μm with Ge used as the optical absorber and Si used as the optical waveguide is exemplified. The near-infrared light having this wavelength is transparent to Si, and is easily absorbed by Ge.

Efficiency of the O/E conversion is an important characteristics of the optical receiver, and is referred to as an optical responsivity. In a PD not having a multiplication function of carriers such as a PIN photo diode (PD), O/E conversion efficiency, that is, the optical responsivity is determined by quantum efficiency which is a ratio of the number of generations of carriers which generate a photocurrent to the number of photons incident onto an optical receiver.

Two factors which affect an optical responsivity of the PIN type PD will be described.

One of the factors is that a product of a light absorption coefficient of a light absorption portion and a propagation length of light defines a maximum value of a theoretical sensitivity. In the following description, absorption saturation in a case where a light intensity is large will be ignored. When the light absorption coefficient is $\alpha[m^{-1}]$, a light intensity I after light having an intensity $I_0$ is incident on the light absorption portion and an absorption region is propagated by a distance L is $I_0 \times \exp(-\alpha L)$. When all the absorbed light is converted to carriers, quantum efficiency at this time is $1-I_0/I=1-\exp(-\alpha L)$. For example, ideal quantum efficiency when $\alpha=4\times10^5[m^{-1}]$ is 33% when a propagation length is 1 μm, and 98% when the propagation length is 10 μm. Therefore, when the same absorbing material is used, a propagation length of light affects an optical responsivity. For example, in a waveguide type PD in which a light absorption region is a waveguide, a high optical responsivity may be obtained by increasing a light propagation length without increasing a volume of a light absorption portion, for example, without increasing a dimension of a light receiver significantly.

The other one of the factors includes a loss due to light absorption or light scattering without generation of carriers. In a case where a doped semiconductor or a metal exists around a light absorption layer, light absorption by free carriers may occur. Such light absorption will not generate the carriers, so that the optical responsivity is lowered.

Next, two factors which affect high-speed operating performance of the PD will be described.

One of the factors is a response bandwidth determined by a time constant of an equivalent electric circuit. Since a reverse biased diode may be regarded as a series RC circuit, a product RC of an element resistance and a capacitance is the time constant. For example, as the device resistance and the device capacitance are smaller, it becomes possible to respond at a higher speed.

The other one of the factors is a time for a carrier generated by light absorption to reach an electrode. This time is referred to as a carrier traveling time. As a matter of course, the shorter the carrier traveling time is, the faster the response is made possible. The carrier traveling time is determined by a distance traveled by a carrier and a speed (a product of a mobility and an electric field strength).

In a normal PIN type PD, a thickness of a depletion layer (an i-type layer) corresponds to a travel distance, and the thinner this thickness, the shorter the carrier traveling time. On the other hand, a capacitance of the PIN type PD becomes larger as the depletion layer becomes thinner, so that an RC time constant becomes larger. Consequently, there is a trade-off between shortening of the carrier traveling time and reduction of the RC time constant.

A moving speed of the carrier varies depending on a material of the PIN type PD and a type of the carrier (a hole or an electron), but tends to increase in accordance with an electric field strength. Therefore, for high speed operation, it is desirable that a voltage applied to the depletion layer is large. Meanwhile, when an intensity per unit area of light incident on a light absorption layer becomes high, a density of carriers generated is excessively increased, and the electric field strength may be lowered due to electric field shielding. Therefore, in the PIN type PD, the response speed may decrease with an increase in the intensity of incident light. For example, in a PIN type PD in which a Ge layer formed over an Si waveguide functions as a light absorption layer, discontinuity of an energy band occurs at an interface between an Si waveguide and the Ge layer, so that carriers, especially holes, are accumulated, and an electric field applied to the depletion layer is significantly deteriorated. One of the applications for the PD is a receiver for coherent transmission, and in the receiver for coherent transmission, a light from a local oscillator is introduced into the PD together with a signal light, and heterodyne detection or homodyne detection is performed. When an intensity of the light from the local oscillator is higher, a reception sensitivity is improved, but band degradation due to the accumulation of holes occurs.

Reference Example

A reference example of a uni-traveling-carrier photo diode (UTC-PD) in Si photonics, instead of the PIN type PD, will be described. FIG. 1 is a cross-sectional view illustrating a configuration of an optical semiconductor device according to the reference example.

An optical semiconductor device 900 according to the reference example includes a silicon on insulator (SOI) substrate 910 including a silicon (Si) substrate 911, an Si oxide film 912, and an Si layer 913. The Si layer 913 includes an n-type Si region 926 and two n$^+$ Si regions 922 sandwiching an n-type Si region 926 in a plan view. The n$^+$ Si region 922 contains an n-type impurity at a concentration higher than that of the n-type Si region 926. An i-type Si layer 925 is formed over the n-type Si region 926. A p-type germanium (Ge) layer 933 is formed over the i-type Si layer 925. An Si oxide film 931 is formed so as to cover a stacked body of the Si layer 913, the i-type Si layer 925, and the p-type Ge layer 933. Two opening portions 931N reaching the n$^+$ Si region 922 and an opening portion 931P reaching the p-type Ge layer 933 are formed over the Si oxide film 931. Two metal films 934N in contact with the n$^+$ Si region 922 through the opening portion 931N and a metal film 934P in contact with the p-type Ge layer 933 through the opening portion 931P are formed over the Si oxide film 931.

In the optical semiconductor device 900 configured as described above, the p-type Ge layer 933 absorbs light and generates carriers. Holes generated in the p-type Ge layer 933 are diffused by dielectric diffusion as a majority carrier, and electrons are moved to the i-type Si layer 925 as a minority carrier. Therefore, the carrier traveling on the i-type Si layer 925 is single, and a carrier traveling time in the optical semiconductor device 900 is determined only by mobility of a single carrier, for example, electrons in this case. Therefore, even in a case where mobility of holes is lower than the mobility of electrons, only electrons having high mobility may be selected and taken out as a signal. As described above, in the PIN type PD, hole accumulation may occur at an interface between the Si layer and the Ge layer, but in the optical semiconductor device 900, the hole does not cross an interface between the i-type Si layer 925 and the p-type Ge layer 933. Therefore, even when light having a high intensity enters, a decrease in the operating speed due to electrostatic shielding is unlikely to occur.

The incidence of light onto the p-type Ge layer 933 is performed across the Si layer 913. In the optical semiconductor device 900, the Si layer 913 is used as an optical waveguide, and light propagated through the Si layer 913 is incident onto the p-type Ge layer 933 by evanescent coupling. At this time, the p-type Ge layer 933 and the Si layer 913 are separated from each other by an amount of a thickness of the i-type Si layer 925, so that a loss is more likely to occur, and the optical responsivity per unit length in a traveling direction of the light is lower. Although the amount of light absorption may be increased by increasing a device length in the traveling direction of the light, a device capacitance increases when the device length is increased. The increase in the device capacitance leads to a bandwidth limitation due to an RC time constant. When the device length is increased, free carrier absorption in the n-type Si region 926 is Increased, and the optical responsivity may deteriorate.

Since the metal film 934P is disposed behind the p-type Ge layer 933 as viewed from the Si layer 913, some pieces of light which may not be absorbed by the p-type Ge layer 933 may be absorbed in the metal film 934P. The light absorption by the metal film 934P is invalid absorption which does not generate a photo carrier effective for photoelectric conversion, so that the optical responsivity is lowered.

For these reasons, in this reference example, a sufficient optical responsivity may not be obtained.

There is also a problem in that it Is difficult to manufacture the optical semiconductor device 900. A method of manufacturing the optical semiconductor device 900 will be described. FIGS. 2A to 2E are cross-sectional views illustrating a method of manufacturing an optical semiconductor device according to the reference example.

Figure 2A:
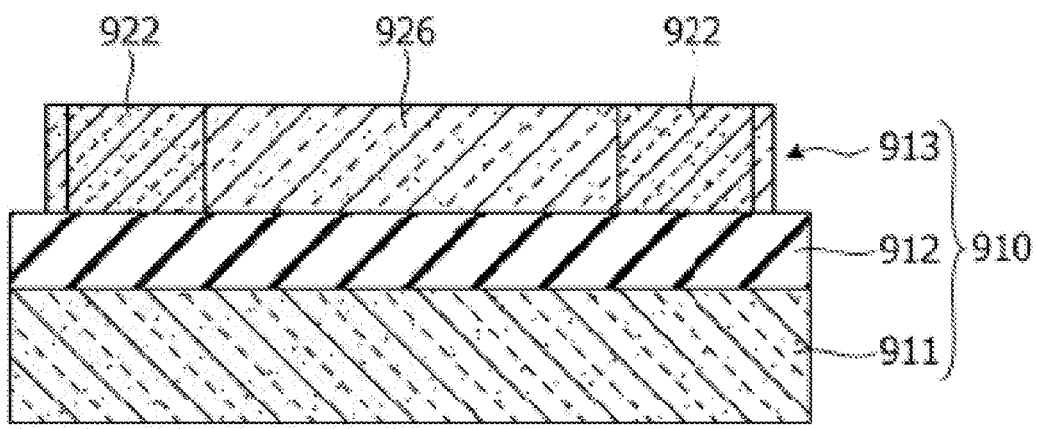
FIG. 2A is a cross-sectional view (No. 1) illustrating a method of manufacturing the optical semiconductor device according to the reference example.

First, as illustrated in FIG. 2A, the SOI substrate 910 is prepared, and the Si layer 913 is processed to a predetermined size. Next, the n-type Si region 926 and n$^+$ Si region 922 are formed by doping an n-type impurity.

Figure 2B:
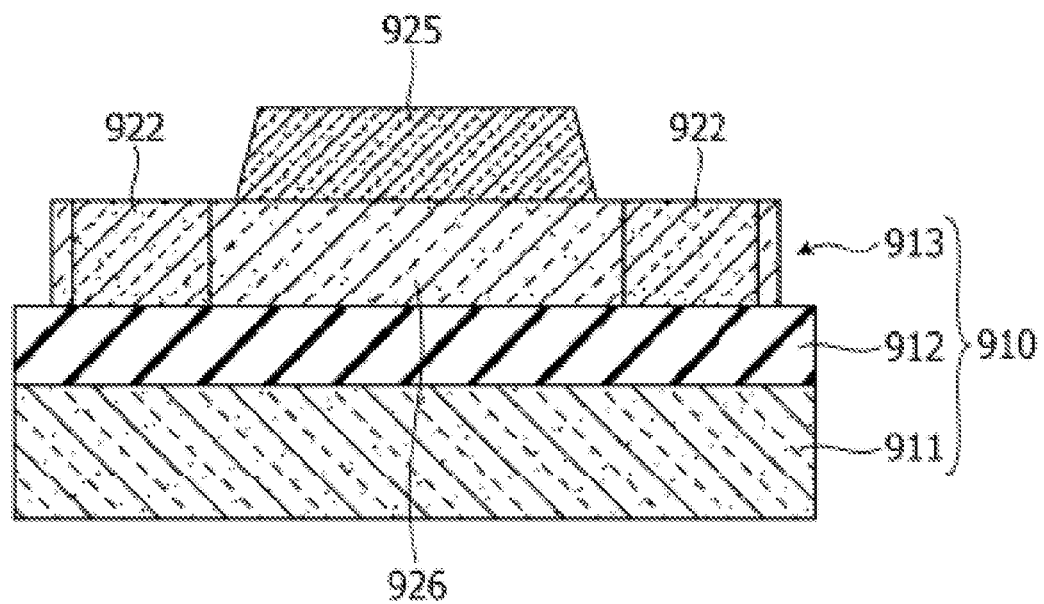
FIG. 2B is a cross-sectional view (No. 2) illustrating the method of manufacturing the optical semiconductor device according to the reference example.

Next, as illustrated in FIG. 2B, by using an oxide film mask, an Si crystal is homoepitaxially grown over the n-type Si region 926 to form the i-type Si layer 925. The i-type Si layer 925 has a thickness of approximately 700 nm.

Figure 2C:
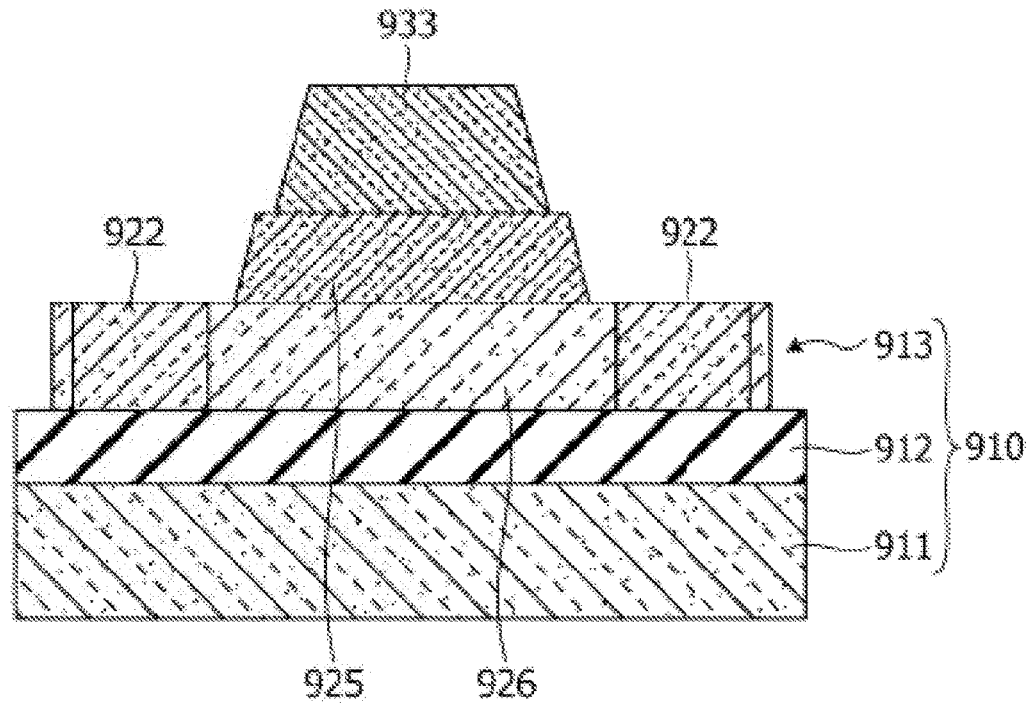
FIG. 2C is a cross-sectional view (No. 3) illustrating the method of manufacturing the optical semiconductor device according to the reference example.

Thereafter, by using another oxide film mask, a Ge crystal is hetero-epitaxially grown over the i-type Si layer 925 to form an i-type Ge layer. Subsequently, as illustrated in FIG. 2C, the p-type Ge layer 933 is formed by doping a p-type impurity into the i-type Ge layer. The p-type Ge layer 933 has a thickness of approximately 1 µm.

Figure 2D:
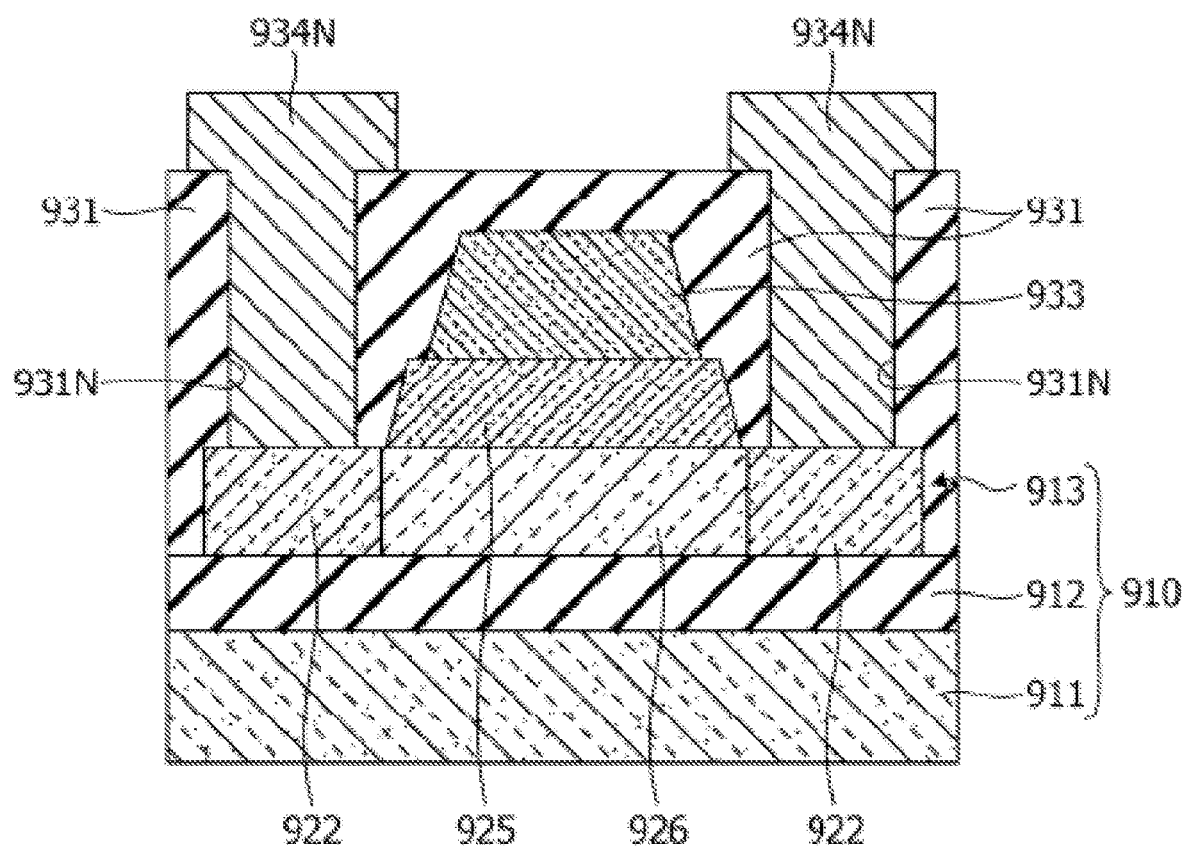
FIG. 2D is a cross-sectional view (No. 4) illustrating the method of manufacturing the optical semiconductor device according to the reference example.

Next, as illustrated in FIG. 2D, the Si oxide film 931 is formed so as to cover a stacked body of the Si layer 913, the i-type Si layer 925, and the p-type Ge layer 933. Thereafter, the opening portion 931N reaching the n$^+$ Si region 922 is formed in the Si oxide film 931, and the metal film 934N in contact with the n+ Si region 922 through the opening portion 931N is formed over the Si oxide film 931.

Figure 2E:
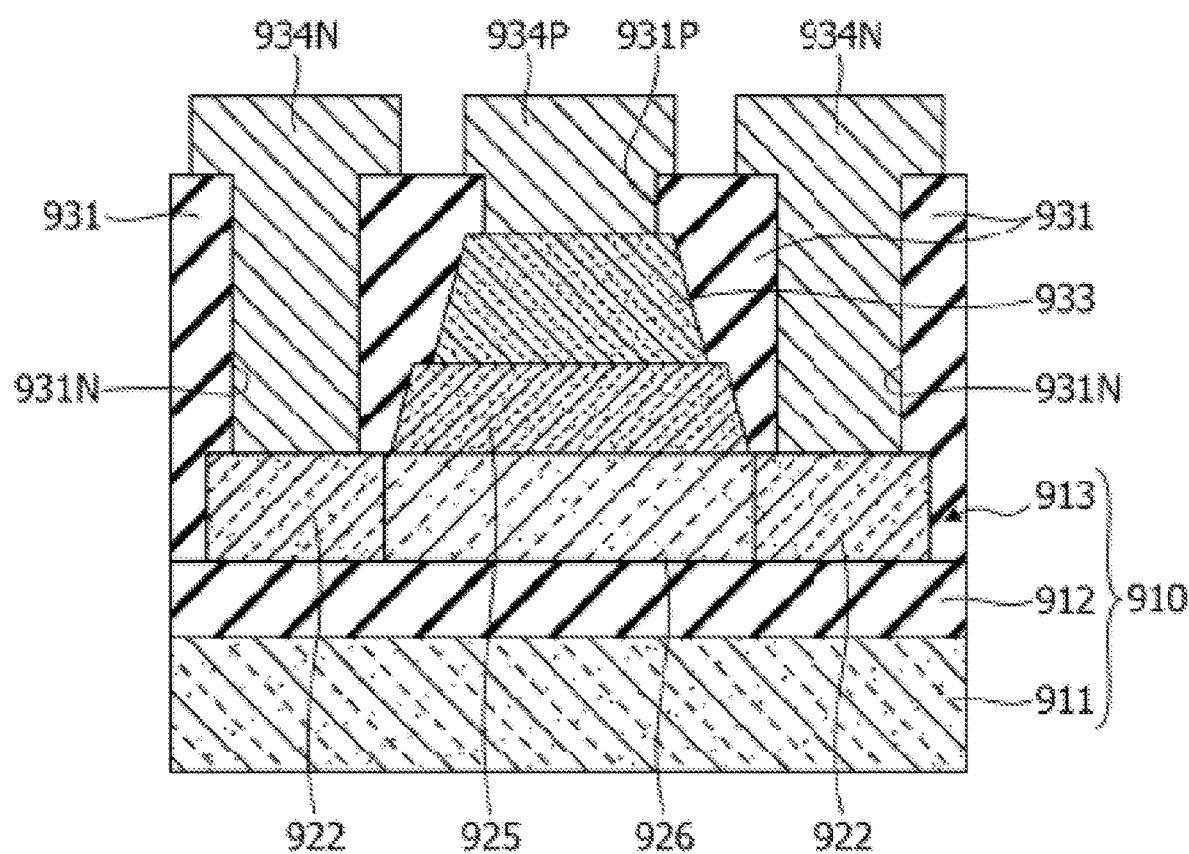
FIG. 2E is a cross-sectional view (No. 5) illustrating the method of manufacturing the optical semiconductor device according to the reference example.

Subsequently, as illustrated in FIG. 2E, the opening portion 931P reaching the p-type Ge layer 933 is formed in the Si oxide film 931, and the metal film 934P in contact with the p-type Ge layer 933 through the opening portion 931P is formed over the Si oxide film 931.

In theory, the optical semiconductor device 900 may be manufactured in this manner.

Meanwhile, although the Si photonics has an advantage in that it is possible to adopt the same high definition process technology as manufacture of an Si type complementary metal-oxide semiconductor (CMOS) transistor or the like, it is impossible to adopt such a high definition process technology as it is for the manufacturing method described above. This is because a level difference between the i-type Si layer 925 and the p-type Ge layer 933 is large. Normally, in the high definition process technology, exposure using a stepper or the like having a small depth of focus is performed, so that the focus is more likely to be blurred as the level difference existing over the substrate is larger. As described above, the i-type Si layer 925 has a thickness of approximately 700 nm and the p-type Ge layer 933 has a thickness of approximately 1 μm, so the level difference therebetween is very large. Therefore, the exposure is performed in a state in which the large level difference in the i-type Si layer 925 and the p-type Ge layer 933 exists over the substrate, so that a focus is blurred. Since a photoresist used in the high definition process has low viscosity, there is a problem that a high level difference is not covered by the photoresist. Therefore, it is significantly difficult to manufacture the optical semiconductor device 900 with high precision.

In this manner, the optical semiconductor device 900 according to the reference example has room for improvement in terms of characteristics and manufacturing processes. The inventor of the present disclosure has made extensive studies based on these findings, and has conceived the following embodiments. Hereinafter, embodiments will be described in detail with reference to accompanying drawings. In the following description, the same or corresponding elements are denoted by the same reference numerals, and the same description will not be repeated.

First Embodiment

Figure 3A:
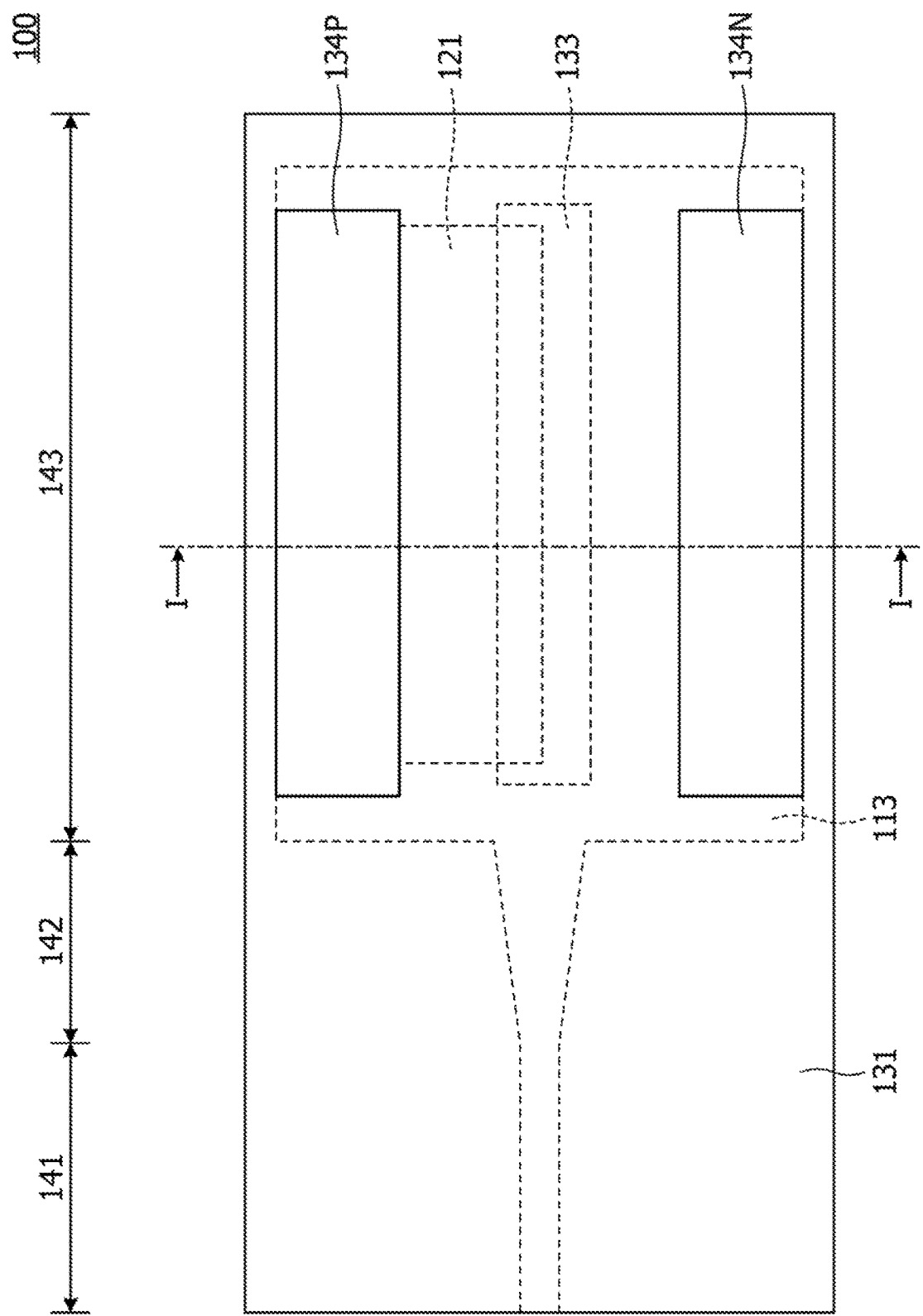
FIG. 3A is a top view illustrating a configuration of an optical semiconductor device according to a first embodiment.
Figure 3B:
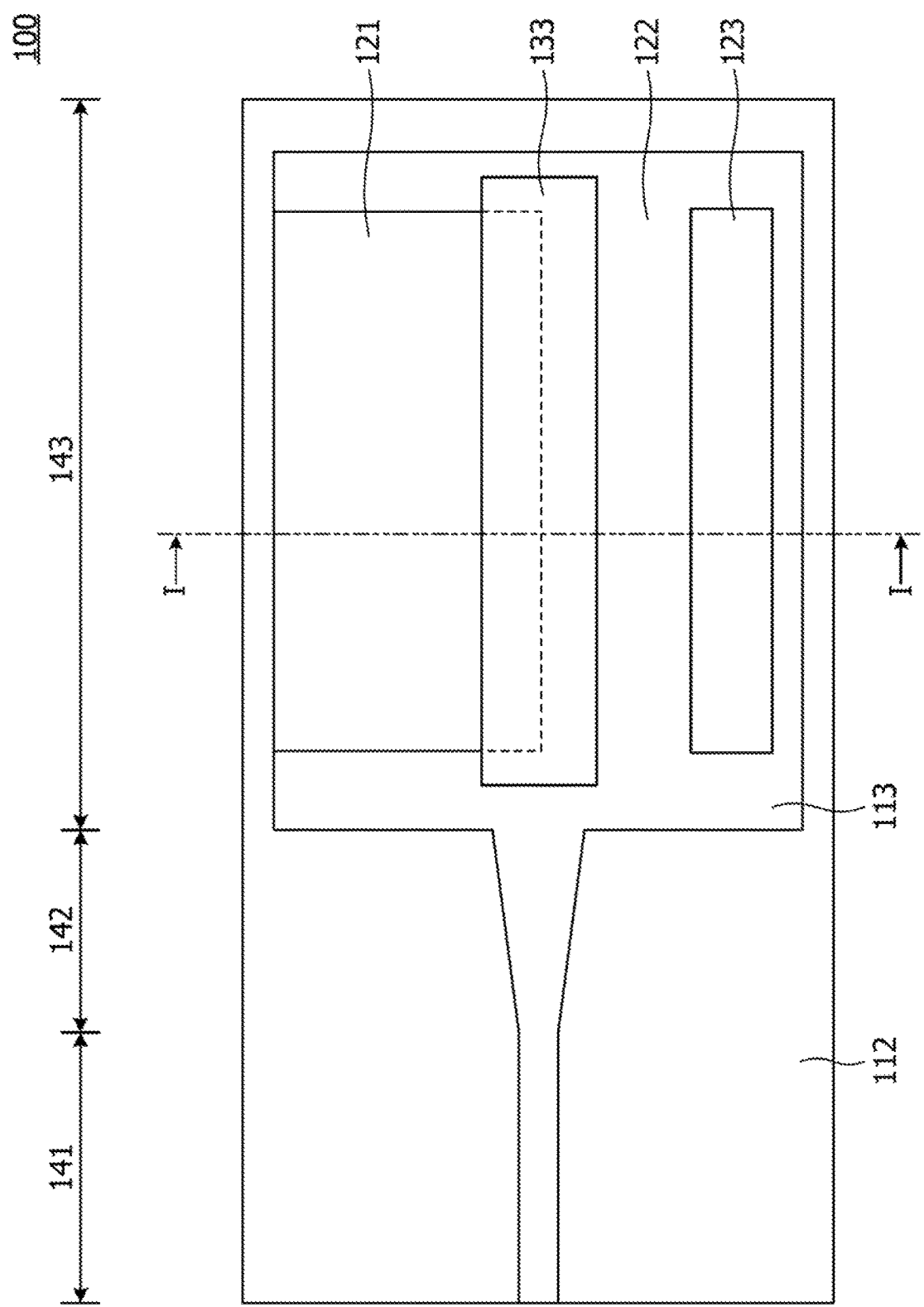
FIG. 3B is a diagram illustrating a layout of a semiconductor region in the optical semiconductor device according to the first embodiment.
Figure 3C:
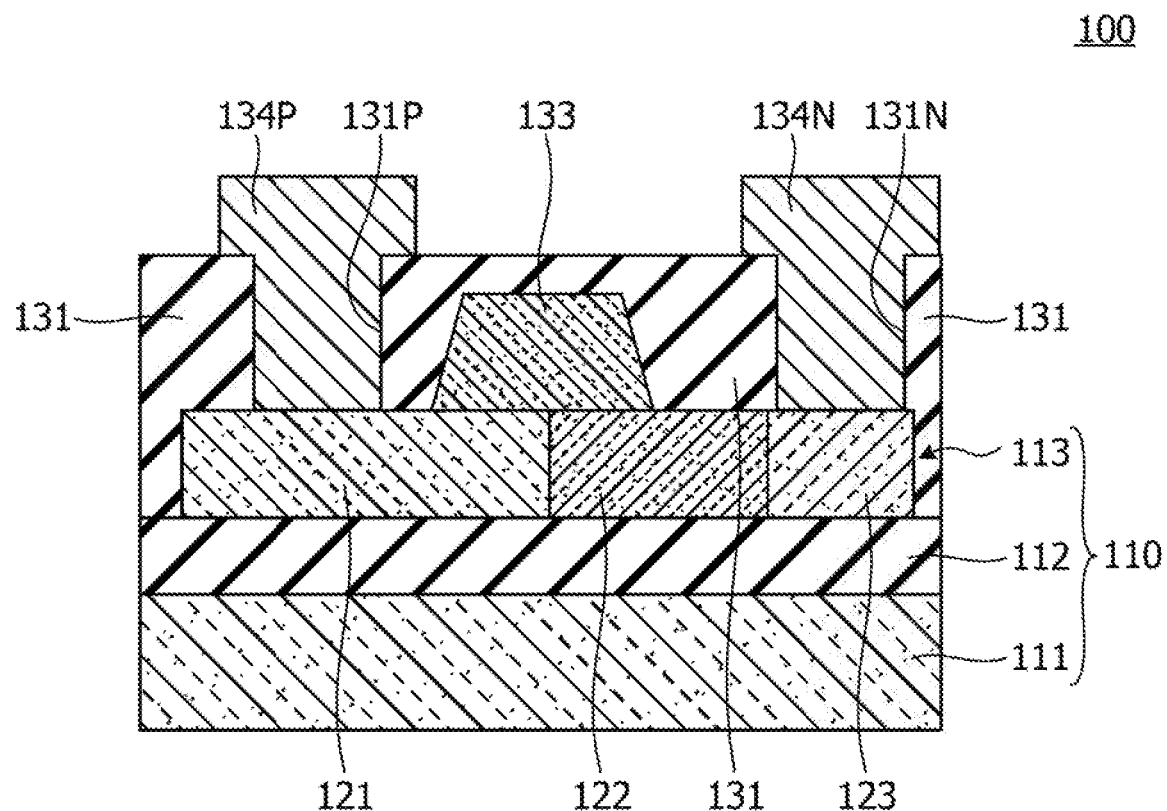
FIG. 3C is a cross-sectional view illustrating a configuration of the optical semiconductor device according to the first embodiment.

First, a first embodiment will be described. The first embodiment relates to an optical semiconductor device including a UTC-PD. FIG. 3A is a top view illustrating a configuration of an optical semiconductor device according to the first embodiment. FIG. 3B is a diagram illustrating a layout of a semiconductor region in the optical semiconductor device according to the first embodiment. FIG. 3C is a cross-sectional view illustrating the configuration of the optical semiconductor device according to the first embodiment. FIG. 3C corresponds to a cross-sectional view taken along a line I-I in FIGS. 3A and 3B.

As illustrated in FIGS. 3A to 3C, an optical semiconductor device 100 according to the first embodiment includes an SOI substrate 110 including an Si substrate 111, an Si oxide film 112, and an Si layer 113. The optical semiconductor device 100 includes a waveguide region 141 of the Si layer 113, a mode converter 142 of the Si layer 113, and a photoelectric converter 143 of the Si layer 113. In the waveguide region 141, the Si layer 113 is processed into a shape of an optical waveguide. In the mode converter 142, the Si layer 113 is processed into a shape of an optical mode converter.

In the photoelectric converter 143, for example, the Si layer 113 is processed into a rectangular planar shape. The Si layer 113 includes a p+ Si region 121, an i-type Si region 122, and an n+ Si region 123. The p+ Si region 121, the i-type Si region 122, and the n+ Si region 123 are arranged in this order in a direction perpendicular to an incident direction of light to the photoelectric converter 143. The i-type Si region 122 is disposed between the p+ Si region 121 and the n+ Si region 123. For example, the p+ Si region 121 contains boron (B) at a concentration of $0.5 \times 10^{19}$ cm$^{-3}$ to $2.5 \times 10^{19}$ cm$^{-3}$. For example, the n+ Si region 123 contains phosphorus (P) at a concentration of $0.5 \times 10^{19}$ cm$^{-3}$ to $1.5 \times 10^{19}$ cm$^{-3}$. The p+ Si region 121 is an example of a first conductive region. The n+ Si region 123 is an example of a second conductive region.

Although an i-type semiconductor is intentionally not doped with an impurity, the i-type semiconductor may contain a slight impurity, for example, an impurity having a concentration equal to or less than $1 \times 10^{15}$ cm$^{-3}$. For example, the i-type Si region 122 may contain an impurity having a concentration equal to or less than $1 \times 10^{15}$ cm$^{-3}$. The i-type Si region 122 is an example of a non-conductive region.

A p-type Ge layer 133 is formed over a part of the p+ Si region 121 and a part of the i-type Si region 122, and a lower surface of the p-type Ge layer 133 is in electrical and mechanical contact with a part of an upper surface of the p+ Si region 121 and a part of an upper surface of the i-type Si region 122. For example, the p-type Ge layer 133 contains B at a concentration of $0.5 \times 10^{19}$a cm$^{-3}$ to $2.5 \times 10^{19}$ cm$^{-3}$. A bandgap of the p-type Ge layer 133 is smaller than a bandgap of the Si layer 113. A refractive index and a light absorption coefficient of the p-type Ge layer 133 are larger than a refractive index and a light absorption coefficient of the Si layer 113.

An Si oxide film 131 is formed so as to cover a stacked body of the Si layer 113 and the p-type Ge layer 133. An opening portion 131P reaching the p+ Si region 121 and an opening portion 131N reaching the n+ Si region 123 are formed in the Si oxide film 131. A metal film 134P in ohmic contact with the p+ Si region 121 through the opening portion 131P and a metal film 134N in ohmic contact with the n+ Si region 123 through the opening portion 131N are formed over the Si oxide film 131. The metal film 134P and the metal film 134N include aluminum (Al), for example. The metal film 134P functions as a p-side electrode, and the metal film 134N functions as an n-side electrode.

Figure 4:
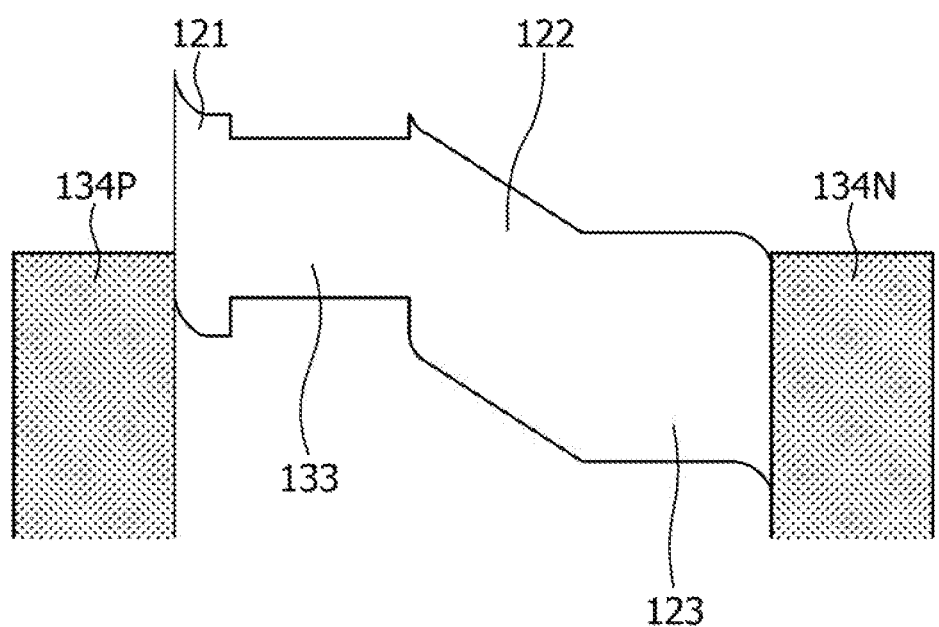
FIG. 4 is a band diagram illustrating the configuration of the optical semiconductor device according to the first embodiment.

An operation of the optical semiconductor device 100 according to the first embodiment will be described. FIG. 4 is a band diagram illustrating a configuration of the optical semiconductor device 100 according to the first embodiment.

In the optical semiconductor device 100, the p-type Ge layer 133 absorbs light and generates carriers. Among the carriers generated in the p-type Ge layer 133, electrons are diffused into the p-type Ge layer 133 and then reach the Si layer 113. At this time, an interface between the p-type Ge layer 133 and the p+ Si region 121 acts as a diffusion blocking layer for electrons. Therefore, the electrons are preferentially guided to the i-type Si region 122, and drift travel in the i-type Si region 122 according to an electric field applied to the i-type Si region 122. On the other hand, holes which are majority carrier are diffused by dielectric diffusion, and are taken out from the metal film 134P through the p⁺ Si region 121. In the same manner as the optical semiconductor device 900 of the reference example, a dielectric relaxation time of the hole does not affect a response speed of the optical semiconductor device 100, and a response time of the optical semiconductor device 100 depends on a traveling time of the electrons.

At this time, since the p-type Ge layer 133 is in contact with the Si layer 113, a loss is small and a mode coupling efficiency is excellent when light is propagated from the Si layer 113 to the p-type Ge layer 133, and the incident light is rapidly transferred to the p-type Ge layer 133. Therefore, the optical responsivity per unit length in the traveling direction of light may be improved, and light may be sufficiently absorbed without increasing the device length. Therefore, it is possible to obtain high speed performance which is small in device capacitance and excellent in terms of RC time constant. Since light is sufficiently absorbed without increasing a distance through which the p⁺ Si region 121 is propagated, invalid light absorption in the p⁺ Si region 121 may be suppressed. Since there is no need to contact the p-type Ge layer 133 with a metal film, the invalid absorption of incident light by the metal film such as the optical semiconductor device 900 may be avoided, so that it is possible to suppress a decrease in an optical responsivity associated with the invalid absorption.

In the present embodiment, a waveguide light mode which is strongly confined in an optical waveguide of the waveguide region 141 is widened by the mode converter 142, and the coupling property to the p-type Ge layer 133 is improved. Therefore, it is possible to improve the optical responsivity Since the waveguide light mode is widened, an intensity (a light intensity density) per unit area of light incident onto the p-type Ge layer 133 which is a light absorption layer is lowered, so that even when light having a high intensity is incident thereon, it is possible to suppress reduction in electric field strength due to electric field shielding and to reduce band degradation.

Although details will be described in a second embodiment, the optical semiconductor device 100 is superior to the optical semiconductor device 900 in terms of the manufacturing process. For example, a high definition process technology in the same manner as that of an Si type CMOS transistor or the like may be adopted. As compared with the method of manufacturing the optical semiconductor device 900 of the reference example, it is not significant to form the step corresponding to the formation of the i-type Si layer 925 or to form the metal contact to the Ge layer, and the number of steps may be reduced.

Second Embodiment

Figure 5C:
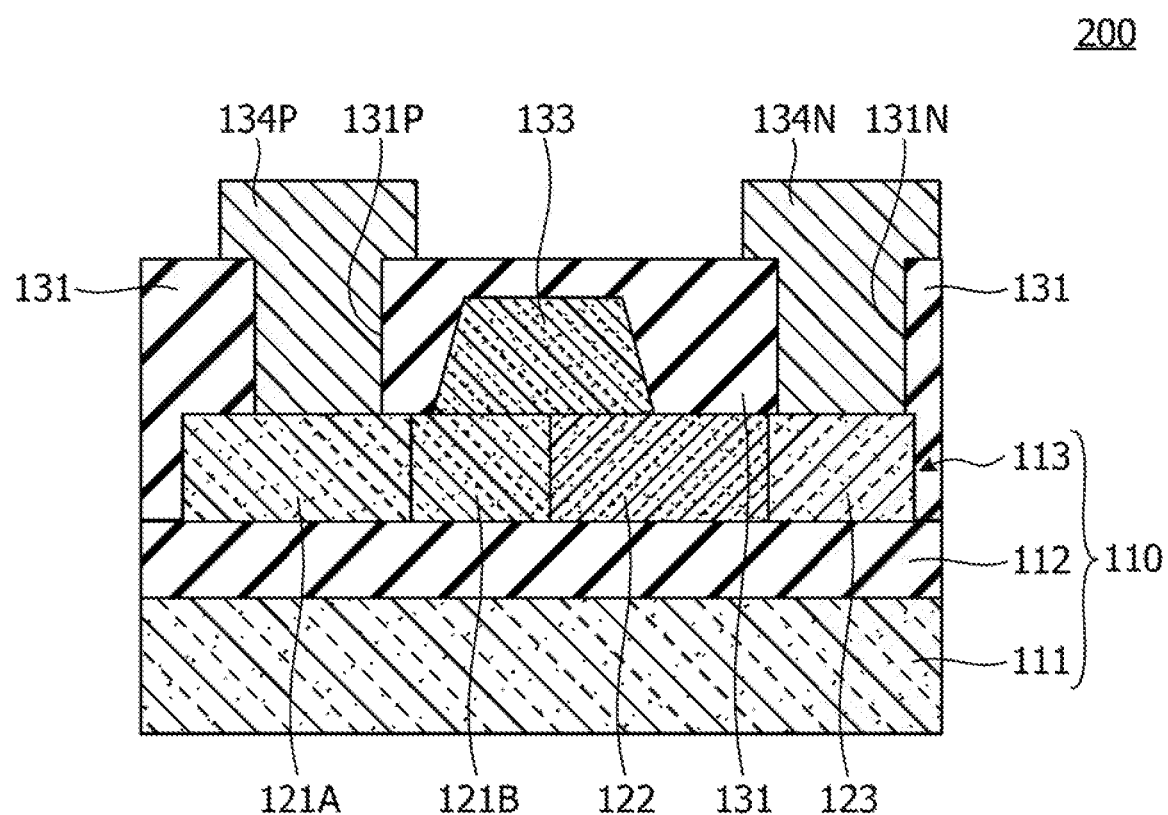
FIG. 5C is a cross-sectional view illustrating the configuration of the optical semiconductor device according to the second embodiment.

Next, the second embodiment will be described. The second embodiment relates to an optical semiconductor device including a UTC-PD. FIG. 5A is a top view illustrating a configuration of an optical semiconductor device according to the second embodiment. FIG. 5B is a diagram Illustrating a layout of a semiconductor region in the optical semiconductor device according to the second embodiment. FIG. 5C is a cross-sectional view illustrating a configuration of the optical semiconductor device according to the second embodiment. FIG. 5C corresponds to a cross-sectional view taken along a line I-I in FIGS. 5A and 5B.

As illustrated in FIG. 5A to FIG. 5C, an optical semiconductor device 200 according to the second embodiment includes the SOI substrate 110 including the Si substrate 111, the Si oxide film 112, and the Si layer 113. The optical semiconductor device 100 includes the waveguide region 141, the mode converter 142, and the photoelectric converter 143. In the waveguide region 141, the Si layer 113 is processed into a shape of an optical waveguide. In the mode converter 142, the Si layer 113 is processed into a shape of an optical mode converter.

In the photoelectric converter 143, for example, the Si layer 113 is processed into a rectangular planar shape. The Si layer 113 includes a p⁺ Si region 121A, a p-type Si region 121B, the i-type Si region 122, and the n⁺ Si region 123. The p⁺ Si region 121A, the p-type Si region 121B, the i-type Si region 122, and the n⁺ Si region 123 are arranged in this order in a direction perpendicular to an incident direction of light to the photoelectric converter 143. The p-type Si region 121B is disposed between the p⁺ Si region 121A and the i-type Si region 122, and the i-type Si region 122 is disposed between the p-type Si region 121B and the n⁺ Si region 123. For example, the p⁺ Si region 121A contains B at a concentration of $0.5 \times 10^{19}$ cm$^{-3}$ to $2.5 \times 10^{19}$ cm$^{-3}$. For example, the p-type Si region 121B contains B at a concentration of $1.5 \times 10^{8}$ cm$^{-3}$ to $2.5 \times 10^{18}$ cm$^{-3}$. The p⁺ Si region 121A is an example of a third conductive region, the p-type Si region 121B is an example of a fourth conductive region, and the p⁺ Si region 121A and the p-type Si region 121B are Included in an example of the first conductive region.

The p-type Ge layer 133 is formed over a part of the p-type Si region 121B and a part of the i-type Si region 122, and a lower surface of the p-type Ge layer 133 is in contact with a part of an upper surface of the p-type Si region 121B and a part of an upper surface of the i-type Si region 122. The Si oxide film 131 is formed so as to cover a stacked body of the Si layer 113 and the p-type Ge layer 133. The opening portion 131P reaches the p⁺ Si region 121A, and the metal film 134P is in ohmic contact with the p⁺ Si region 121A through the opening portion 131P.

The other configurations are the same as in the first embodiment.

With the optical semiconductor device 200 according to the second embodiment, the same effect as that of the optical semiconductor device 100 according to the first embodiment may be obtained.

Since the lower surface of the p-type Ge layer 133 is in contact with a part of the upper surface of the p-type Si region 121B in which a concentration of a p-type impurity is lower than a concentration of a p-type impurity in the p⁺ Si region 121A, it is possible to further suppress deterioration in sensitivity due to free carrier absorption in the p-type Si region as compared with the first embodiment.

As described below, the optical semiconductor device 200 is superior to the optical semiconductor device 900 in terms of the manufacturing process. FIGS. 6A, 7A, 8A, 9A, 10A, 11A, 12A, 13A, 14A, 15A, 16A, 17A, 18A, and 19A are top views illustrating a method of manufacturing the optical semiconductor device 200 according to the second embodiment. FIGS. 6B, 7B, 8B, 9B, 10B, 11B, 12B, 13B, 14B, 15B, 16B, 17B, 18B, and 19B are cross-sectional views illustrating the method of manufacturing the optical semiconductor device 200 according to the second embodiment. FIGS. 6B, 7B, 8B, 9B, 10B, 11B, 12B, 13B, 14B, 15B, 16B, 17B, 18B, and 19B respectively correspond to cross-sectional views taken along lines I-I in FIGS. 6A, 7A, 8A, 9A, 10A, 11A, 12A, 13A, 14A, 15A, 16A, 17A, 18A, and 19A.

Figure 6B:
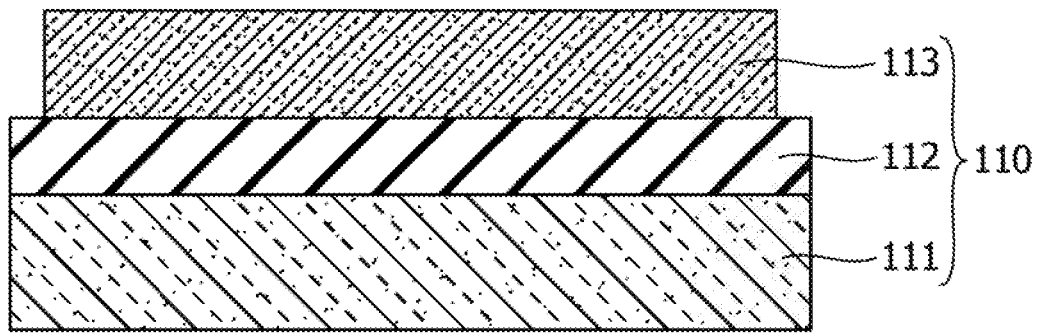
FIG. 6B is a cross-sectional view (No. 1) illustrating the method of manufacturing the optical semiconductor device according to the second embodiment.

First, as illustrated in FIGS. 6A and 6B, the SOI substrate 110 is prepared, and the Si layer 113 is processed. For example, the Si substrate 111 has a thickness of 700 μm to 800 μm, the Si oxide film 112 has a thickness of 1.5 μm to 2.5 μm, and the Si layer 113 has a thickness of 200 nm to 300 nm. The Si layer 113 may be processed by electron beam (EB) lithography and inductively coupled plasma (ICP) dry etching. For example, the Si layer 113 is processed into a straight line shape extending in one direction in the waveguide region 141, processed into a planar shape extending from the waveguide region 141 toward the photoelectric converter 143 in the mode converter 142, and is processed into a rectangular planar shape in the photoelectric converter 143.

Figure 7B:
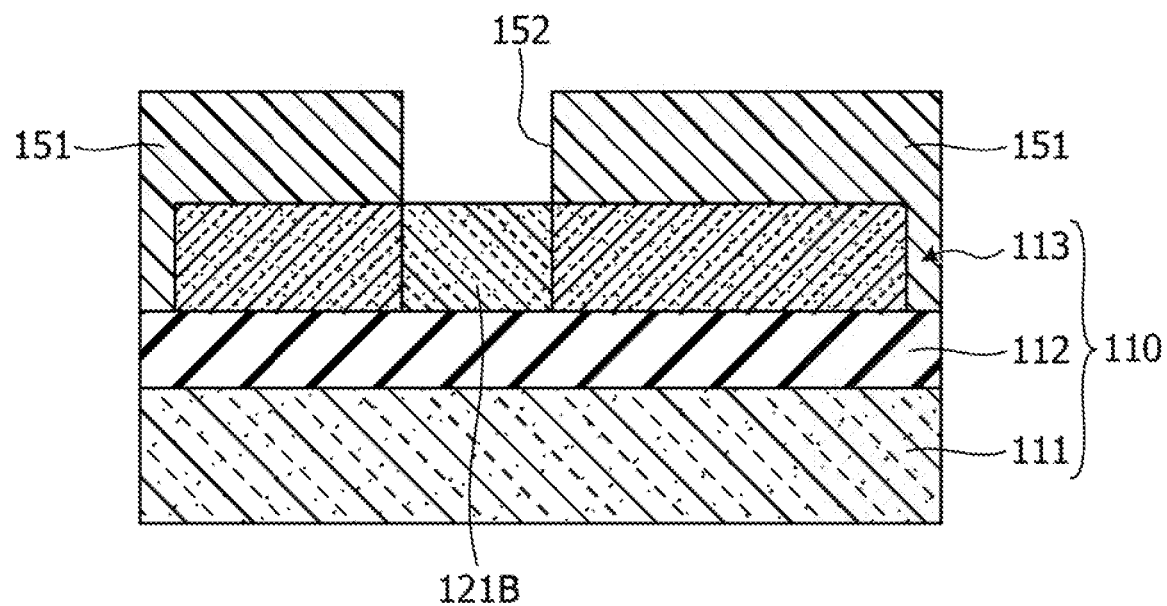
FIG. 7B is a cross-sectional view (No. 2) illustrating the method of manufacturing the optical semiconductor device according to the second embodiment.

Next, as illustrated in FIGS. 7A and 7B, a photoresist mask 151 including an opening portion 152 for opening a predetermined region to form the p-type Si region 121B is formed over the SOI substrate 110. The photoresist mask 151 may be formed by coating, exposing, and developing of photoresist agents. Thereafter, the p-type Si region 121B is formed in the Si layer 113 by ion implantation of a p-type impurity.

Figure 8B:
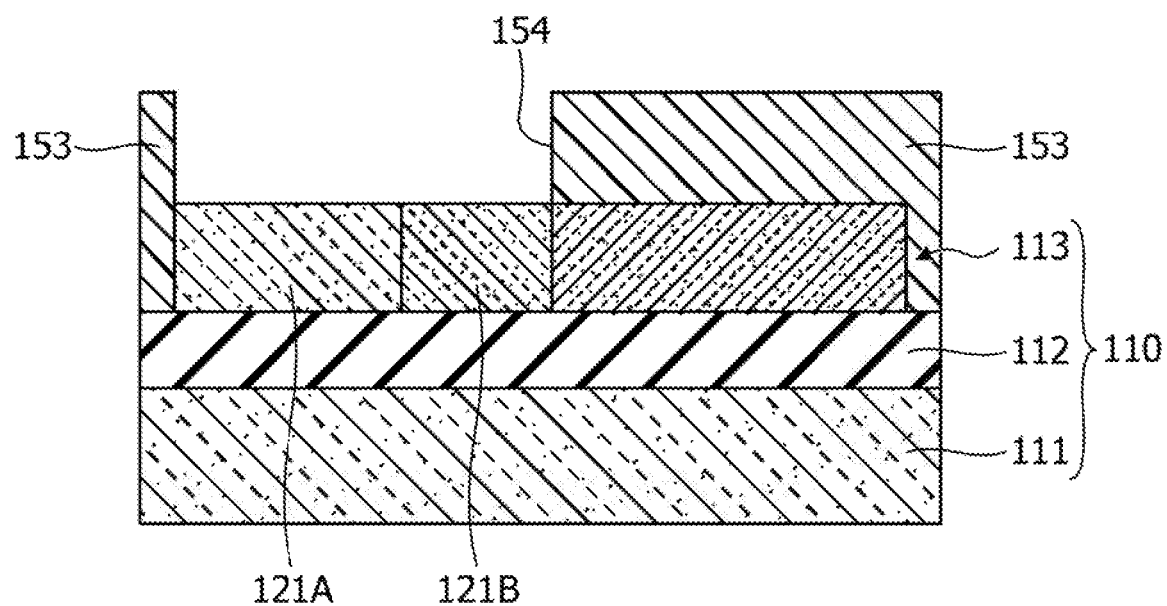
FIG. 8B is a cross-sectional view (No. 3) illustrating the method of manufacturing the optical semiconductor device according to the second embodiment.

Subsequently, as illustrated in FIGS. 8A and 8B, the photoresist mask 151 is removed, and a photoresist mask 153 including an opening portion 154 for opening a predetermined region to form the $p^+$ Si region 121A is formed over the SOI substrate 110. The photoresist mask 153 may be formed by coating, exposing, and developing of photoresist agents. Next, the $p^+$ Si region 121A is formed in the Si layer 113 by ion implantation of a p-type impurity.

Figure 9A:
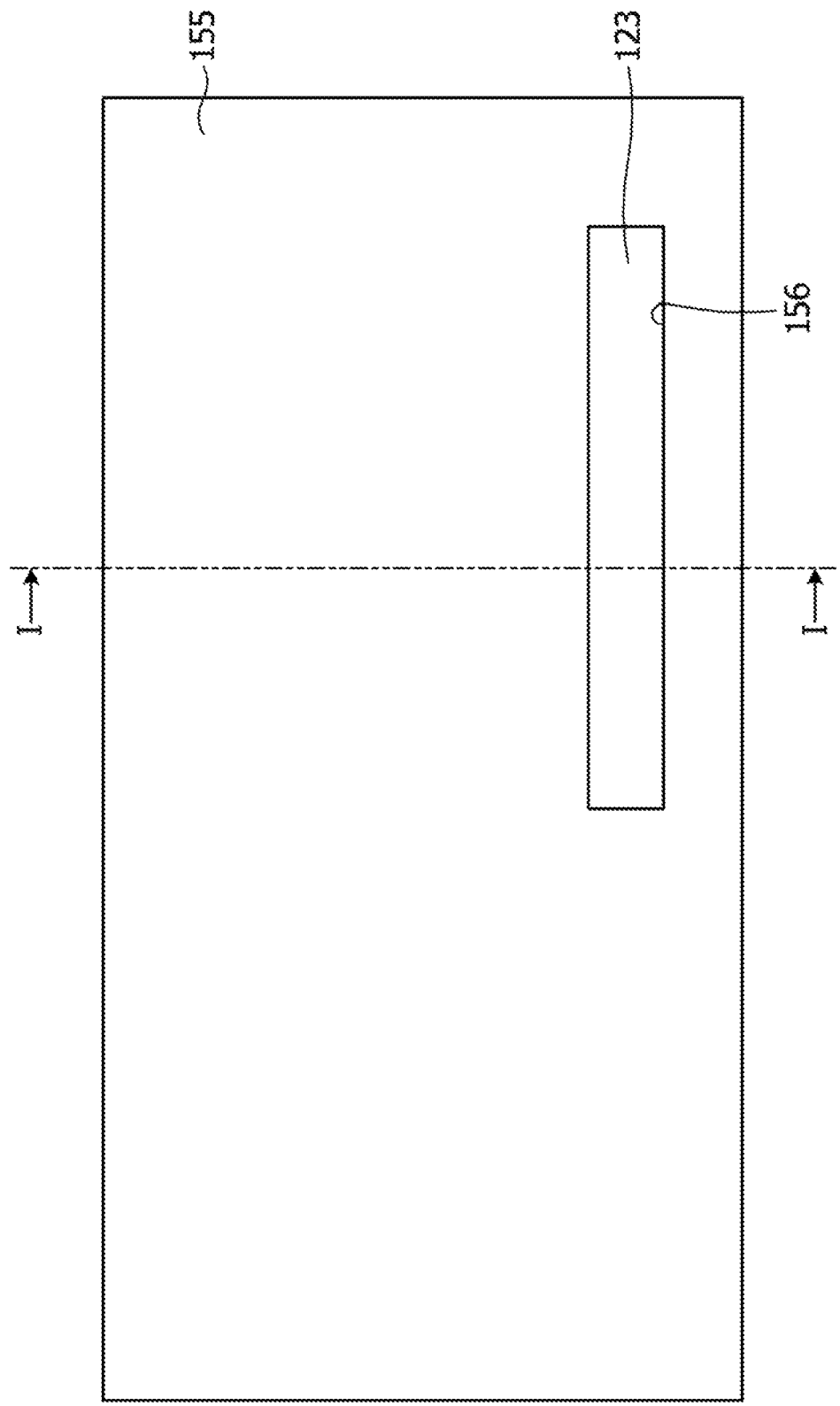
FIG. 9A is a top view (No. 4) illustrating the method of manufacturing the optical semiconductor device according to the second embodiment.
Figure 9B:
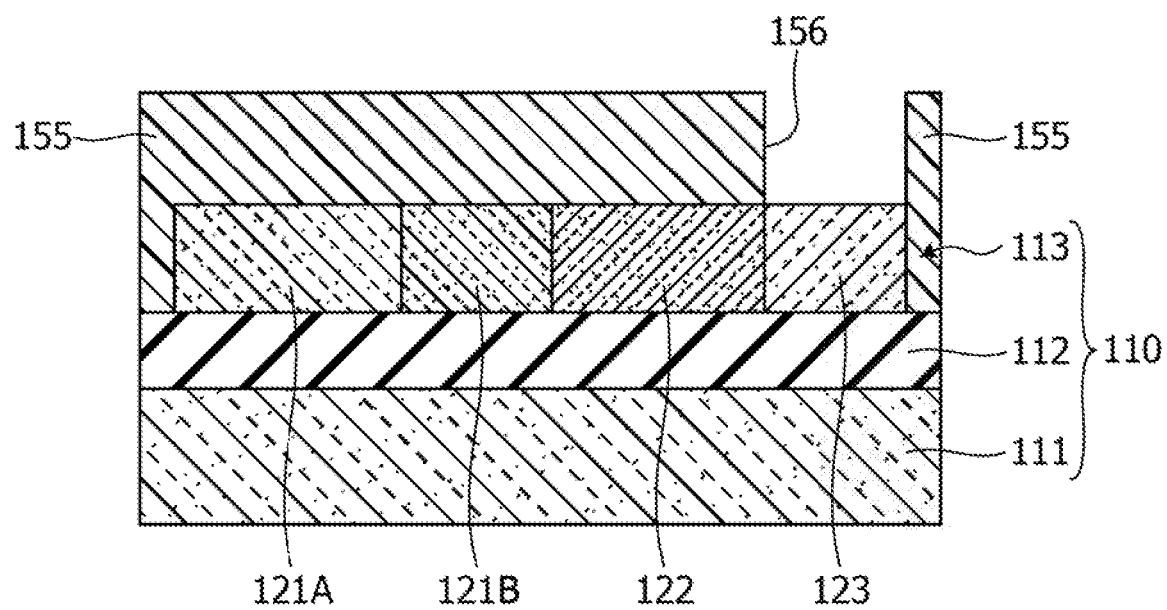
FIG. 9B is a cross-sectional view (No. 4) illustrating the method of manufacturing the optical semiconductor device according to the second embodiment.

Thereafter, as illustrated in FIGS. 9A and 9B, the photoresist mask 153 is removed, and a photoresist mask 155 having an opening portion 156 for opening a predetermined region to form the $n^+$ Si region 123 is formed over the SOI substrate 110. The photoresist mask 155 may be formed by coating, exposing, and developing of photoresist agents. Next, the $n^+$ Si region 123 is formed in the Si layer 113 by ion implantation of an n-type impurity. In the Si layer 113, the i-type Si region 122 is formed between the p-type Si region 121B and the $n^+$ Si region 123.

Figure 10B:
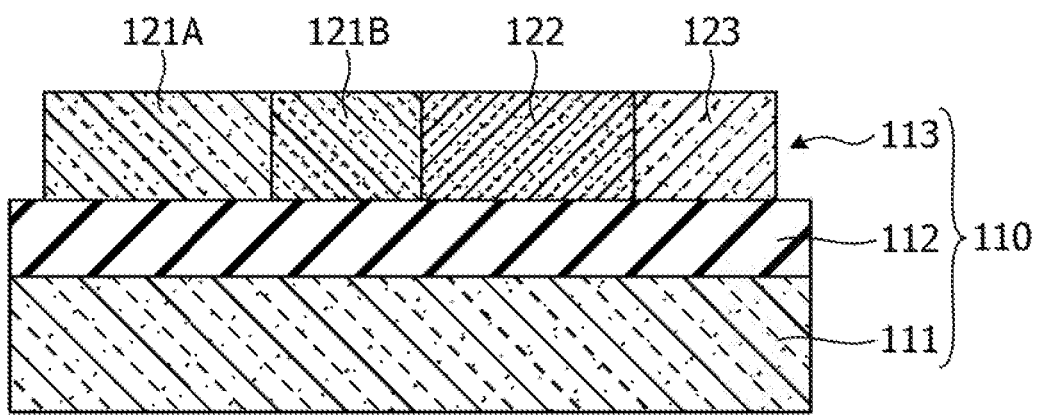
FIG. 10B is a cross-sectional view (No. 5) illustrating the method of manufacturing the optical semiconductor device according to the second embodiment.

Thereafter, as illustrated in FIGS. 10A and 10B, the photoresist mask 155 is removed.

Figure 11B:
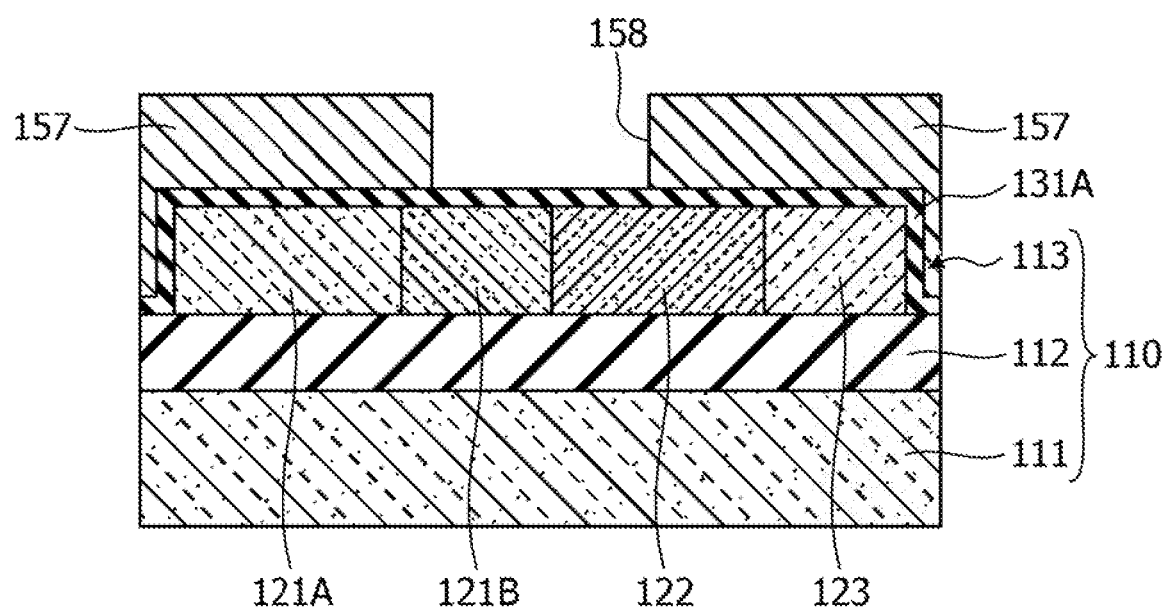
FIG. 11B is a cross-sectional view (No. 6) illustrating the method of manufacturing the optical semiconductor device according to the second embodiment.

Next, as illustrated in FIG. 11A and FIG. 11B, an Si oxide film 131A is formed over the SOI substrate 110. The Si oxide film 131A may be formed by a chemical vapor deposition (CVD) method, for example, and the Si oxide film 131A may have a thickness of 10 nm to 30 nm. Thereafter, a p-type impurity and an n-type impurity implanted into the Si layer 113 are activated by annealing. The annealing is performed, for example, at a temperature of 900° C. to 1100° C., for a time of 0.5 minutes to 2 minutes.

Thereafter, as illustrated in FIG. 11A and FIG. 11B, a photoresist mask 157 including an opening portion 158 for opening a predetermined region to form the p-type Ge layer 133 is formed over the Si oxide film 131A. The photoresist mask 157 may be formed by coating, exposing, and developing of photoresist agents. For example, a total length of the opening portion 158 is 25 µm to 35 µm, and a total width is 1.5 µm to 2.5 µm.

Figure 12B:
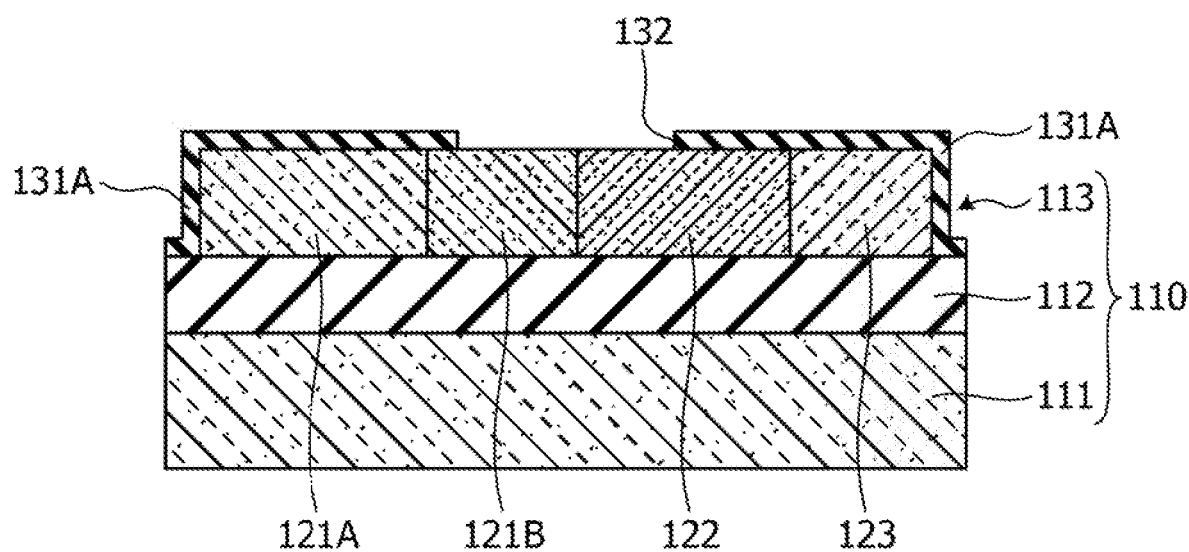
FIG. 12B is a cross-sectional view (No. 7) illustrating the method of manufacturing the optical semiconductor device according to the second embodiment.

Subsequently, as illustrated in FIG. 12A and FIG. 12B, an opening portion 132 is formed in the Si oxide film 131A by dry etching of the Si oxide film 131A. Next, the photoresist mask 157 is removed.

Figure 13A:
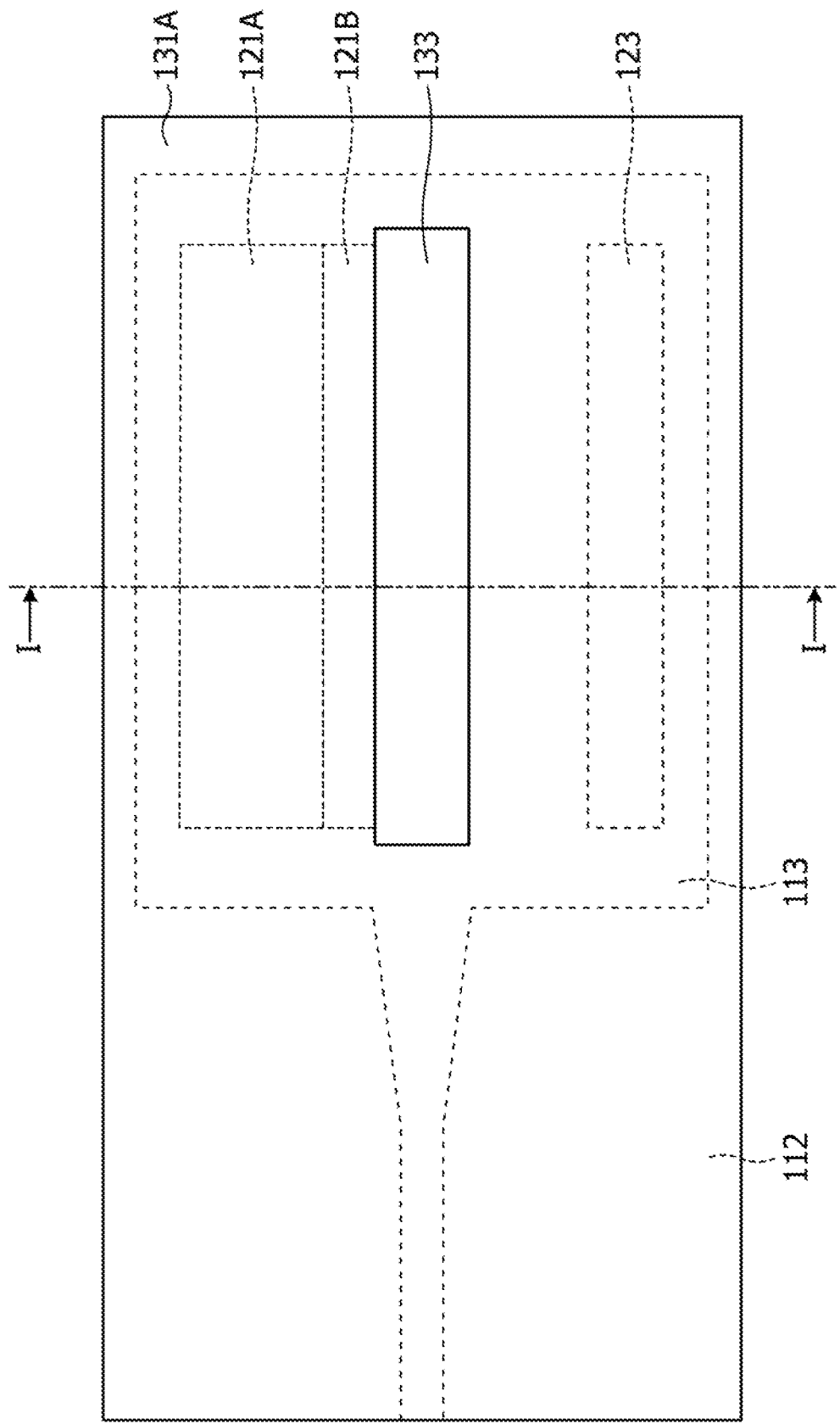
FIG. 13A is a top view (No. 8) illustrating the method of manufacturing the optical semiconductor device according to the second embodiment.
Figure 13B:
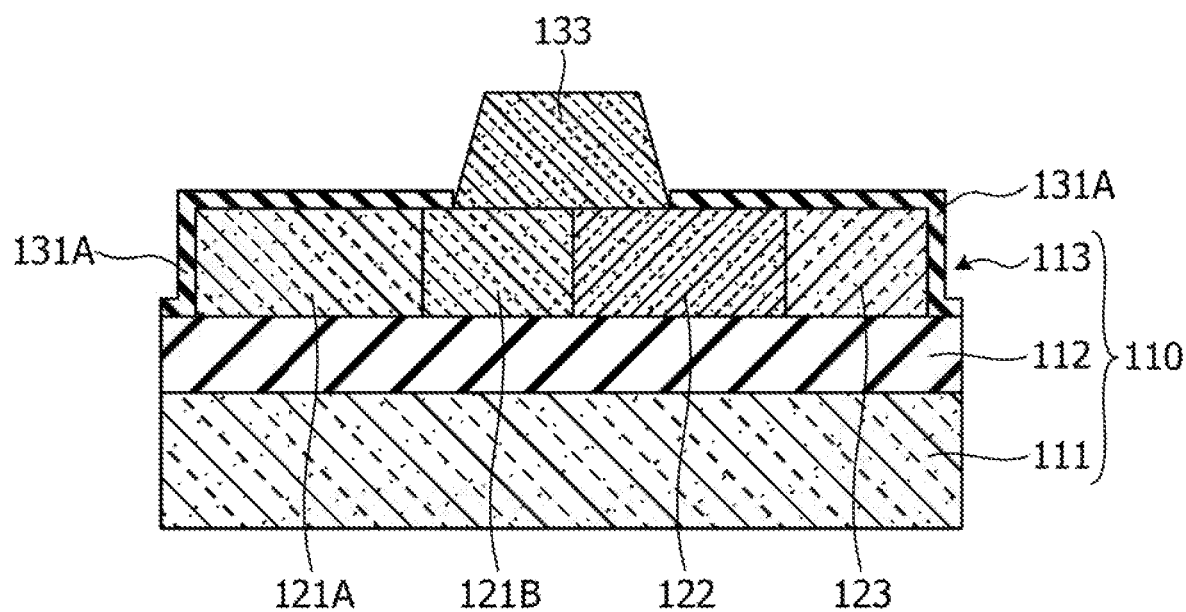
FIG. 13B is a cross-sectional view (No. 8) illustrating the method of manufacturing the optical semiconductor device according to the second embodiment.

Thereafter, as illustrated in FIG. 13A and FIG. 13B, the p-type Ge layer 133 is formed on an inner side of the opening portion 132 over the Si layer 113. The p-type Ge layer 133 may be formed by a low pressure (LP) CVD method, for example, and has a thickness of 150 nm to 250 nm. For example, the p-type Ge layer 133 is hetero-epitaxially grown in a mesa shape. When the p-type Ge layer 133 is grown, in-situ doping of a p-type impurity is performed.

Figure 14B:
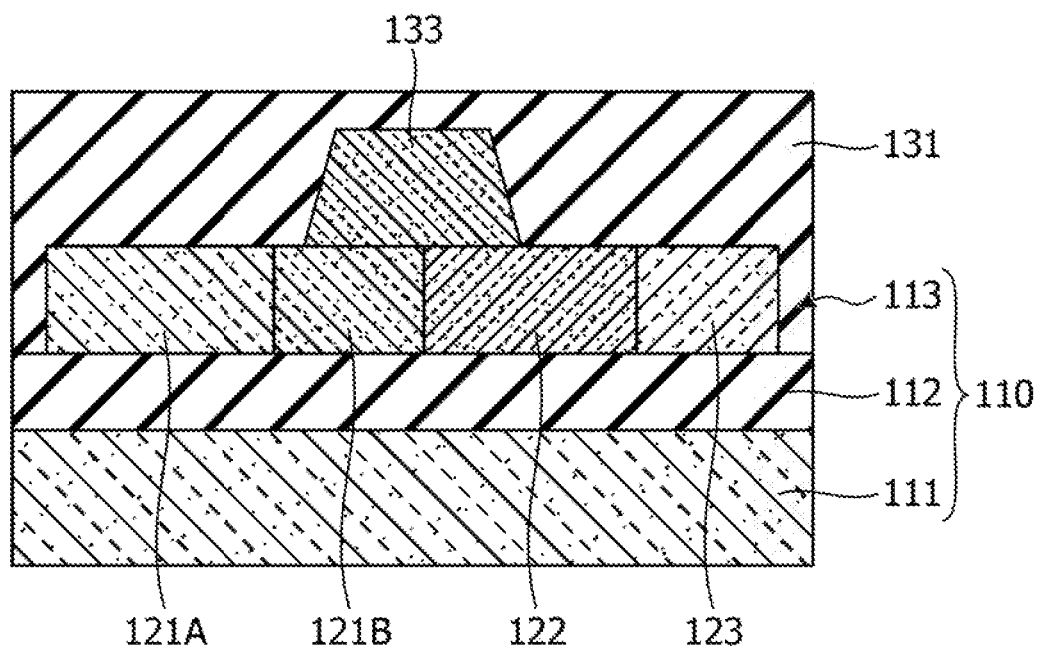
FIG. 14B is a cross-sectional view (No. 9) illustrating the method of manufacturing the optical semiconductor device according to the second embodiment.

Next, as illustrated in FIGS. 14A and 14B, an Si oxide film is formed over the Si oxide film 131A to cover the p-type Ge layer 133, for example, by a CVD method, and the Si oxide film 131 including the Si oxide film 131A is formed.

Figure 15B:
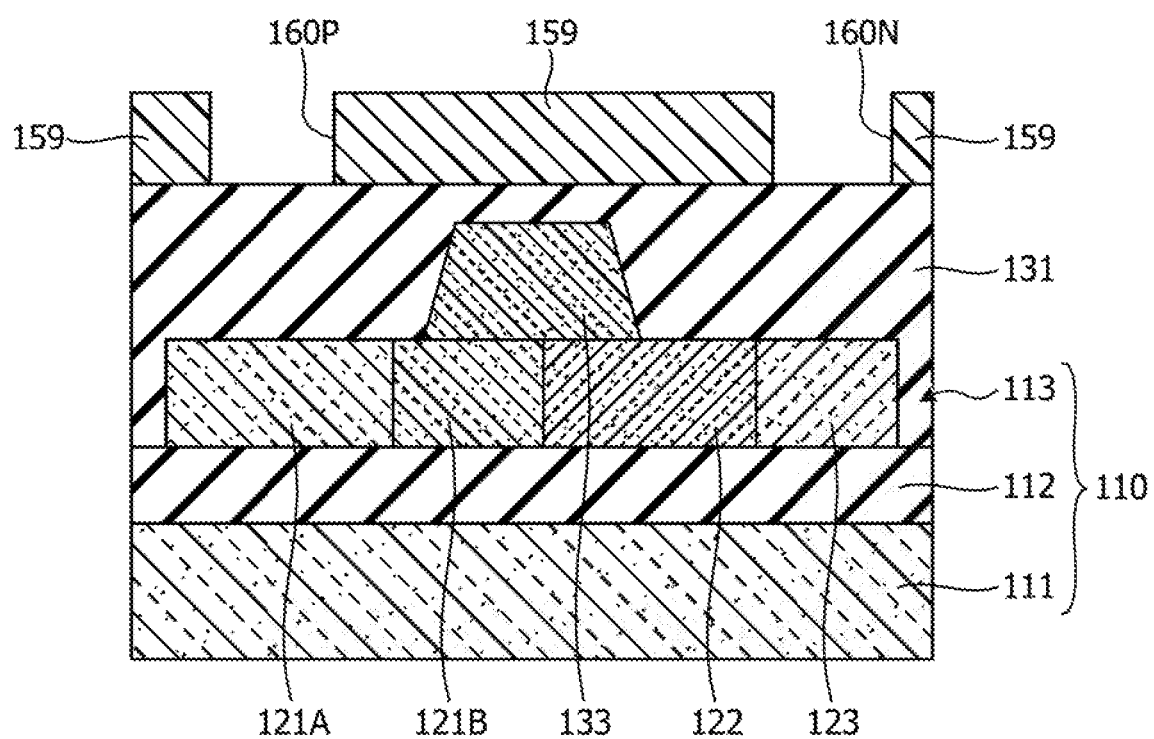
FIG. 15B is a cross-sectional view (No. 10) illustrating the method of manufacturing the optical semiconductor device according to the second embodiment.

Next, as illustrated in FIGS. 15A and 15B, a photoresist mask 159 including an opening portion 160P for opening a predetermined region to form the opening portion 131P and an opening portion 160N for opening a predetermined region to form the opening portion 131N is formed over the Si oxide film 131. The photoresist mask 159 may be formed by coating, exposing, and developing of photoresist agents. Since the p-type Ge layer 133 has a thickness of 150 nm to 250 nm, it is possible to perform exposure with high accuracy.

Figure 16A:
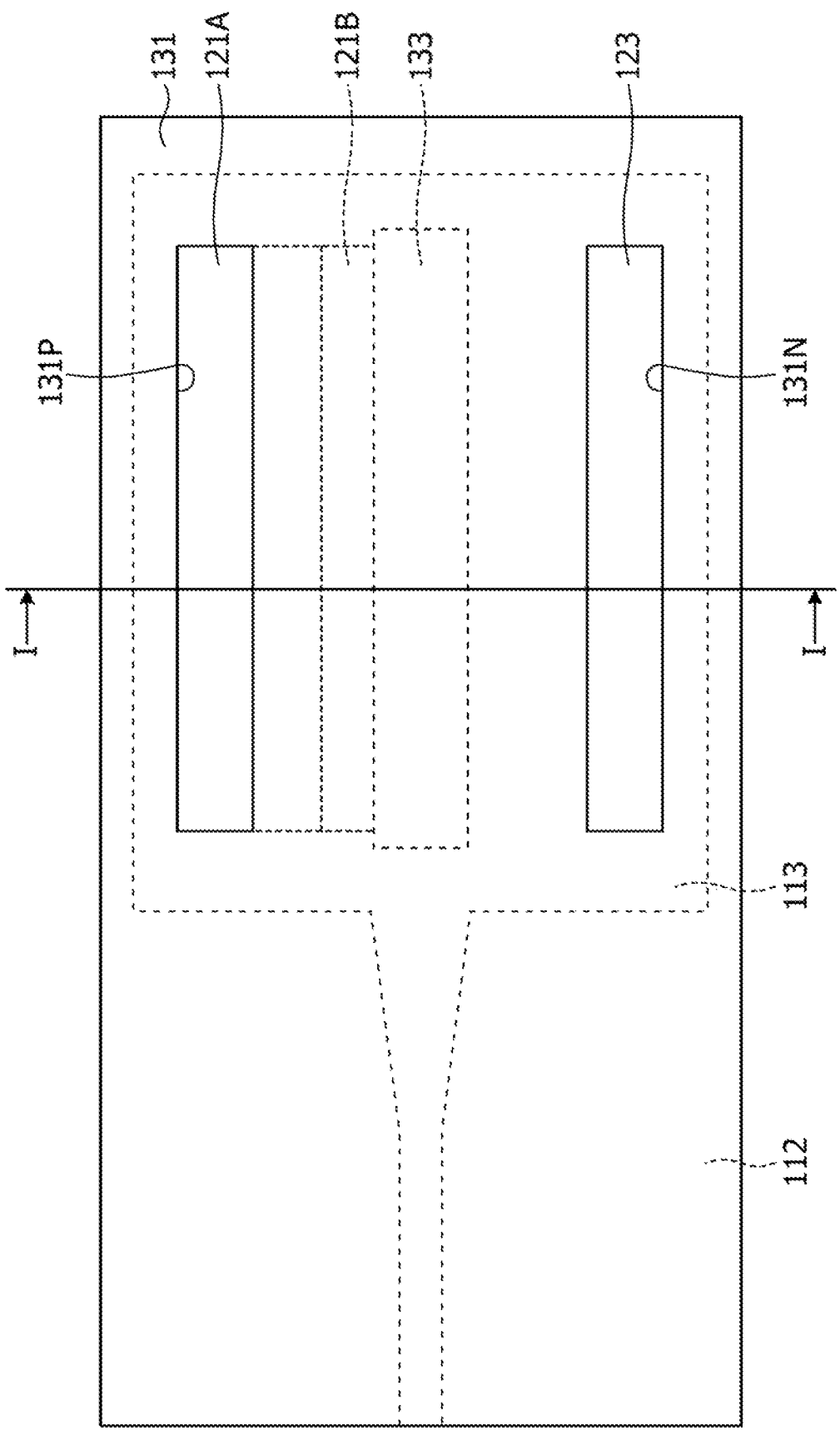
FIG. 16A is a top view (No. 11) illustrating the method of manufacturing the optical semiconductor device according to the second embodiment.
Figure 16B:
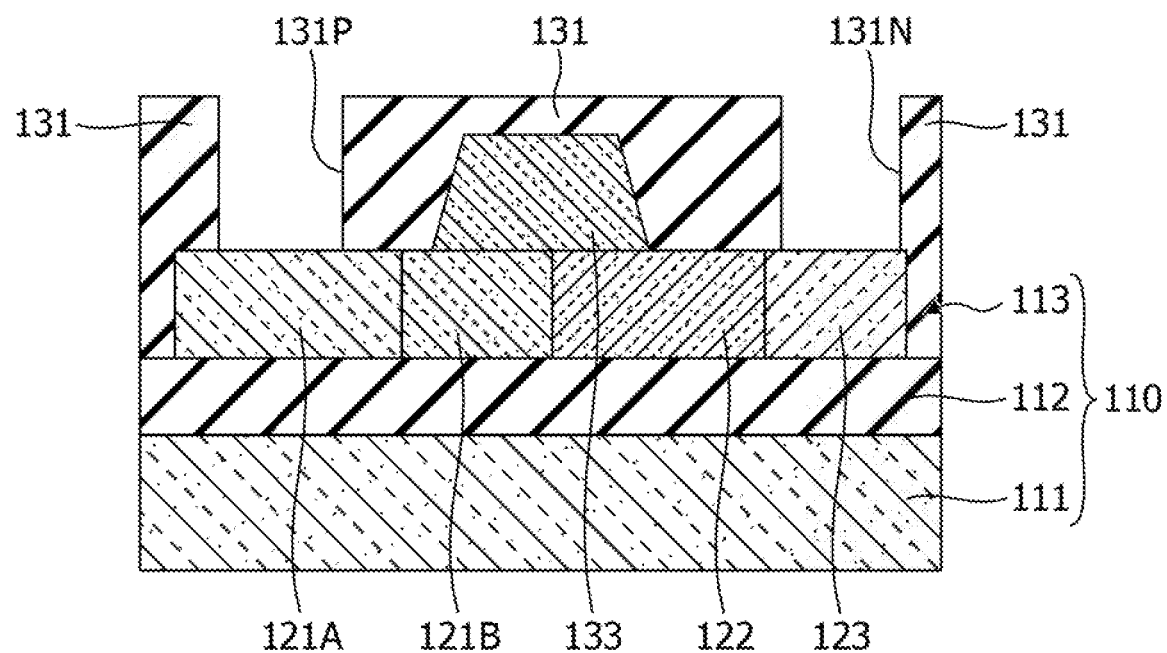
FIG. 16B is a cross-sectional view (No. 11) illustrating the method of manufacturing the optical semiconductor device according to the second embodiment.

Subsequently, as illustrated in FIGS. 16A and 16B, the opening portion 131P reaching the $p^+$ Si region 121A and the opening portion 131N reaching the $n^+$ Si region 123 are formed in the Si oxide film 131. The opening portion 131P and the opening portion 131N may be formed by, for example, dry etching. Next, the photoresist mask 159 is removed.

Figure 17B:
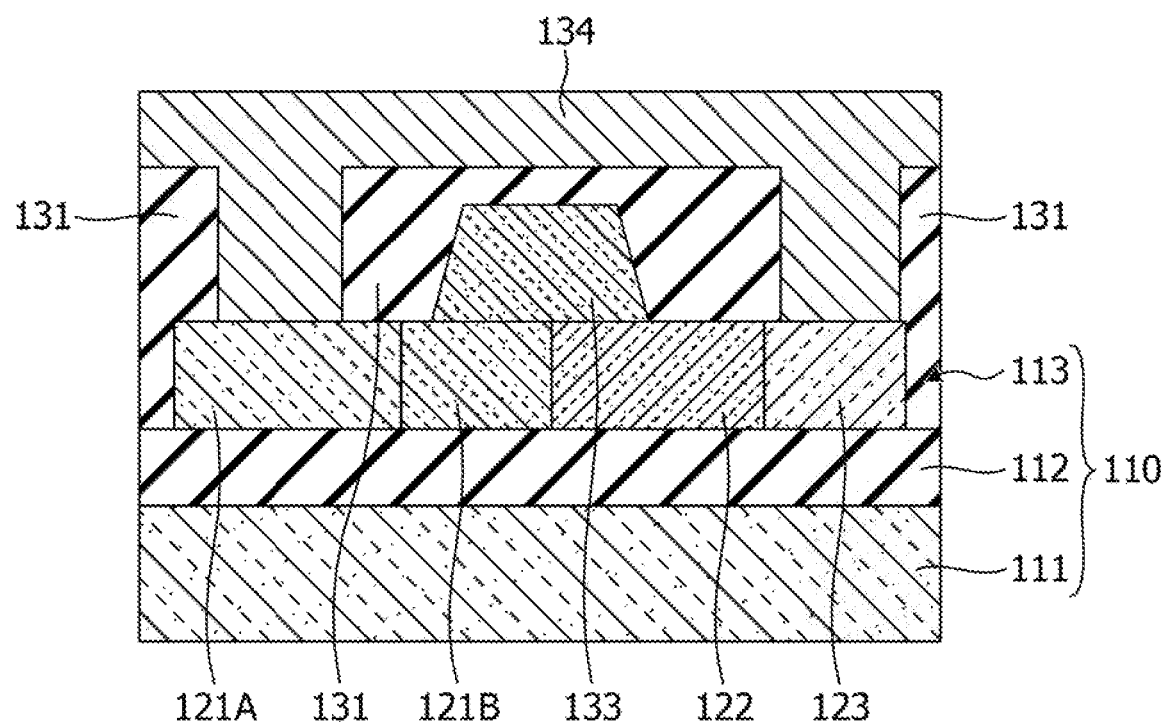
FIG. 17B is a cross-sectional view (No. 12) illustrating the method of manufacturing the optical semiconductor device according to the second embodiment.

Thereafter, as illustrated in FIGS. 17A and 17B, a metal film 134 is formed over the Si oxide film 131 so as to fill the opening portion 131P and the opening portion 131N. As the metal film 134, for example, an Al film is formed by a sputtering method.

Figure 18B:
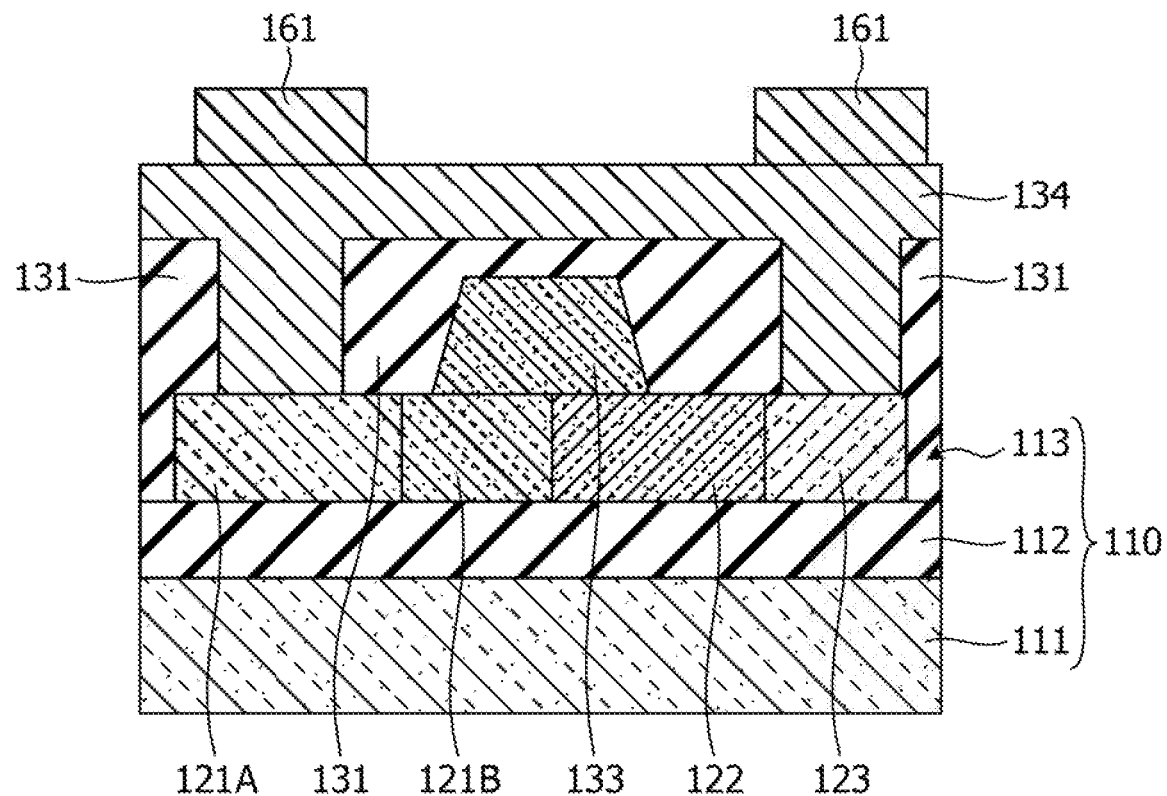
FIG. 18B is a cross-sectional view (No. 13) illustrating the method of manufacturing the optical semiconductor device according to the second embodiment.

Subsequently, as illustrated in FIGS. 18A and 18B, a photoresist mask 161 is formed to cover a predetermined region for forming the metal film 134P and a predetermined region for forming the metal film 134N. The photoresist mask 161 may be formed by coating, exposing, and developing of photoresist agents.

Figure 19A:
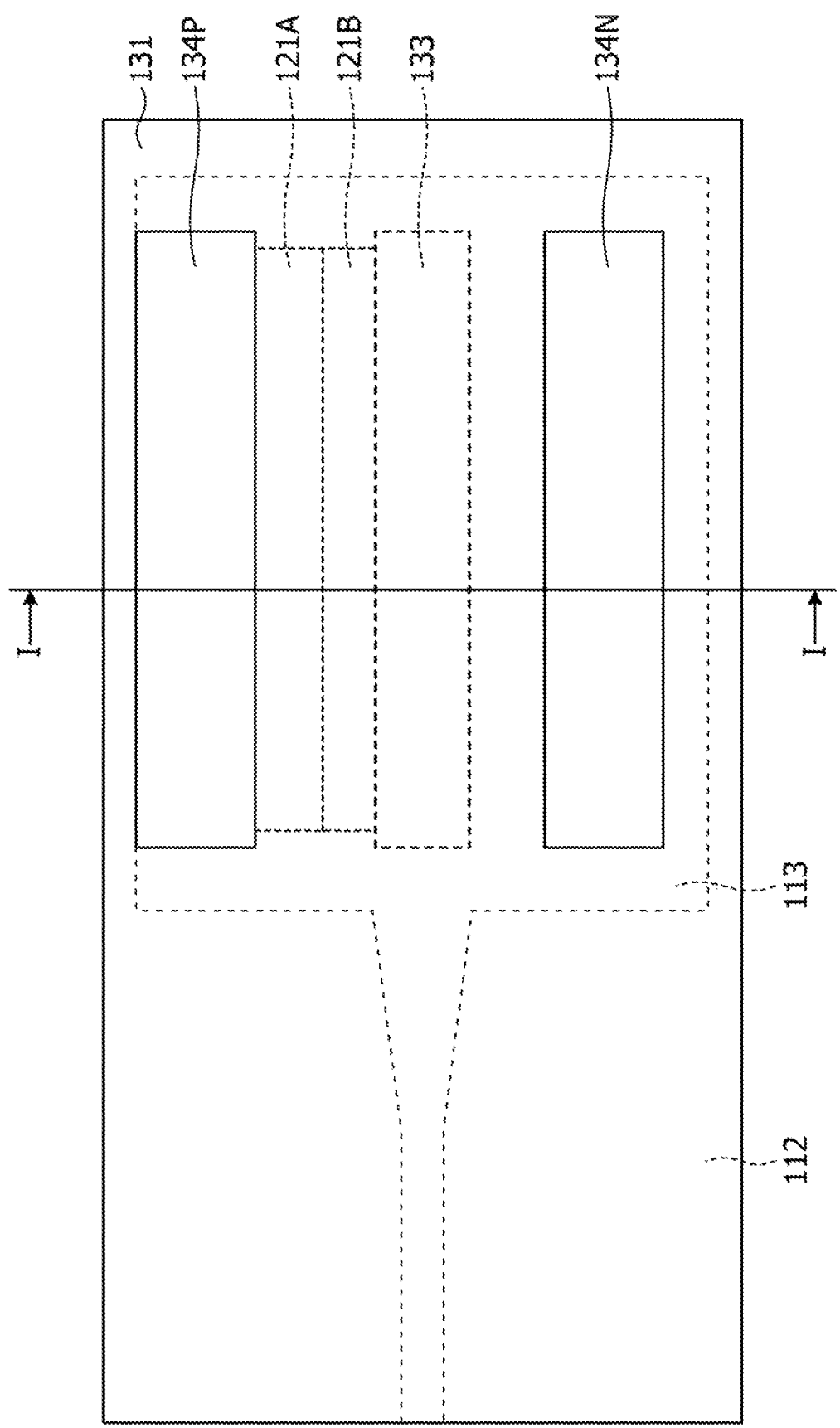
FIG. 19A is a top view (No. 14) illustrating the method of manufacturing the optical semiconductor device according to the second embodiment.
Figure 19B:
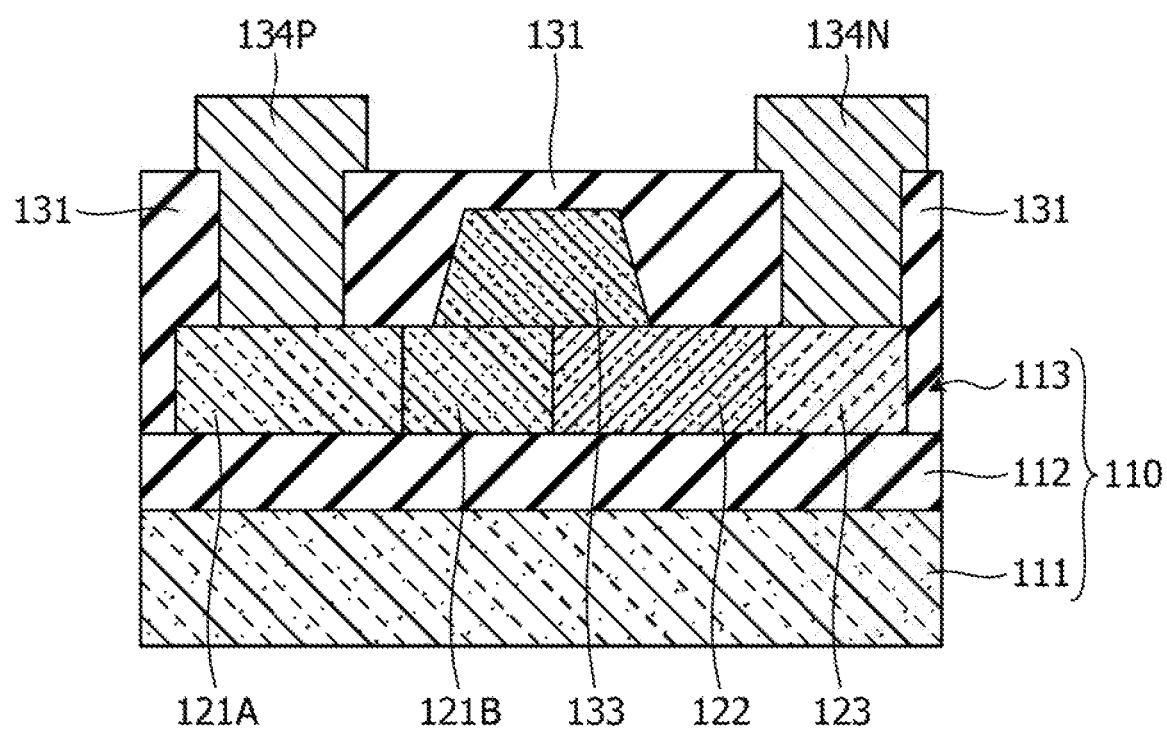
FIG. 19B is a cross-sectional view (No. 14) illustrating the method of manufacturing the optical semiconductor device according to the second embodiment.

Next, as illustrated in FIGS. 19A and 19B, dry etching of the metal film 134 is performed to form the metal film 134P and the metal film 134N. Thereafter, the photoresist mask 161 is removed.

In this manner, the optical semiconductor device 200 according to the second embodiment may be manufactured.

In this method, since the level difference is small, it is possible to cover the entire surface by using a thin photoresist agent with low viscosity, and it is possible to perform the high definition process. Since there is no level difference enough to blur the focus when the photoresist agent is exposed to light, high definition exposure may be performed at all times. Since an object in ohmic contact with the metal film 134P is an Si layer, an appropriate impurity profile is easily obtained in a thickness direction. Even when ion implantation for forming the $p^+$ Si region 121A in ohmic contact with the metal film 134P becomes excessive, the light absorption layer does not exist below the ion implantation layer, so that the influence on light absorption is significantly small.

As compared with the method of manufacturing the optical semiconductor device 900 of the reference example, there is no need to form the step corresponding to the formation of the i-type Si layer 925 or to form the metal contact to the Ge layer, and the number of steps may be reduced.

Third Embodiment

Figure 20:
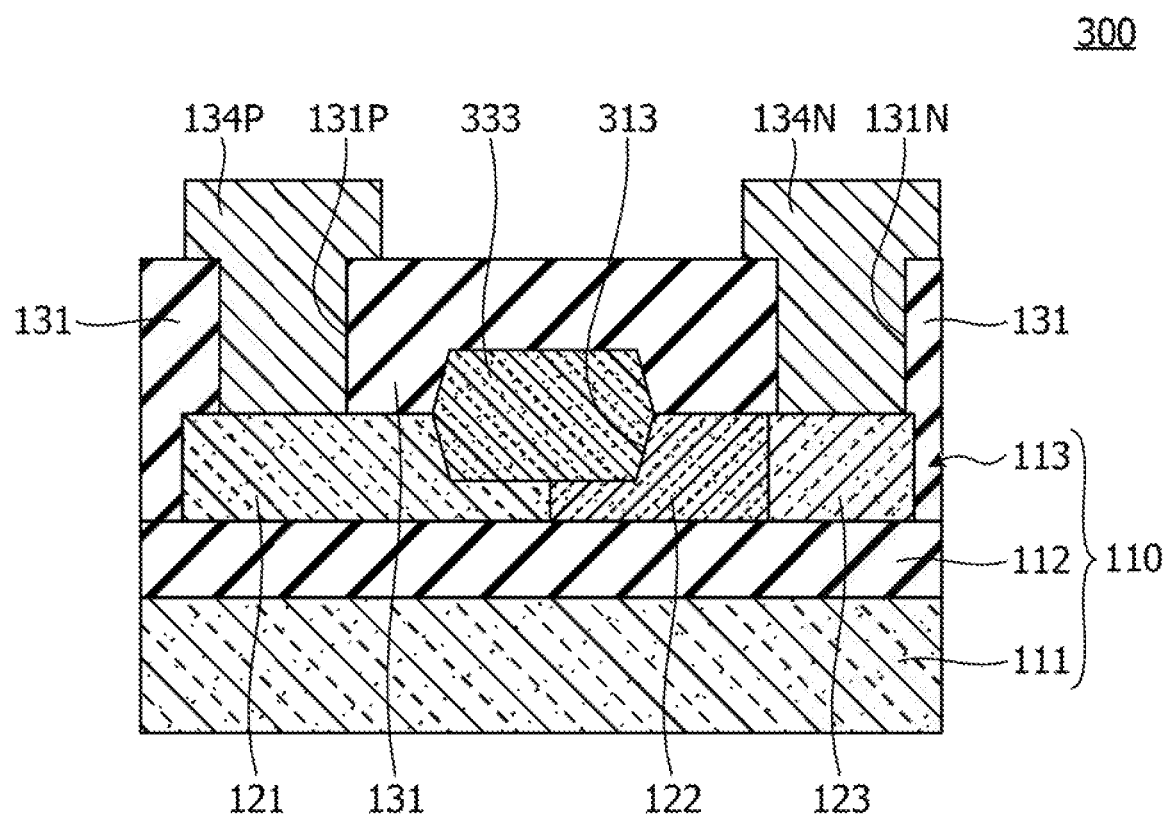
FIG. 20 is a cross-sectional view illustrating a configuration of an optical semiconductor device according to a third embodiment.

Next, a third embodiment will be described. The third embodiment relates to an optical semiconductor device Including a UTC-PD. FIG. 20 is a cross-sectional view illustrating a configuration of an optical semiconductor device according to the third embodiment. FIG. 20 corresponds to a cross-sectional view taken along a line I-I in FIGS. 3A and 3B in accordance with the first embodiment.

As illustrated in FIG. 20, in an optical semiconductor device 300 according to the third embodiment, a recess 313 is formed in the p+ Si region 121 and the i-type Si region 122 of the Si layer 113, and a p-type Ge layer 333 is formed instead of the p-type Ge layer 133 so as to fill the recess 313. For example, the optical semiconductor device 300 adopts a butt joint type structure. For example, the recess 313 has a depth of 80 nm to 120 nm. A thickness of the Si layer 113 at a portion at which the recess 313 is formed is thinner than the surrounding portion. The other configurations are the same as in the second embodiment.

In the optical semiconductor device 300, the p-type Ge layer 333 absorbs light and generates carriers. Among the carriers generated in the p-type Ge layer 333, electrons are diffused into the p-type Ge layer 333 and then reach the Si layer 113. At this time, an interface between the p-type Ge layer 333 and the p+ Si region 121 acts as a diffusion blocking layer for electrons. Therefore, the electrons are preferentially guided to the i-type Si region 122, and drift travel in the i-type Si region 122 according to an electric field applied to the i-type Si region 122. On the other hand, in the same manner as in the first embodiment, holes which are majority carriers are diffused in the opposite direction to electrons by dielectric diffusion, and are taken out from the metal film 134P through the p+ Si region 121.

The same effects as those in the first embodiment may be obtained. Since the p-type Ge layer 333 is formed so as to fill the recess 313, light may be introduced into the p-type Ge layer 333 with high efficiency. Since a height of an upper surface of the p-type Ge layer 133 based on an upper surface of the Si layer 113 as a reference is lower than a height of an upper surface of the p-type Ge layer 333, it is possible to further improve accuracy of exposure.

Figure 21:
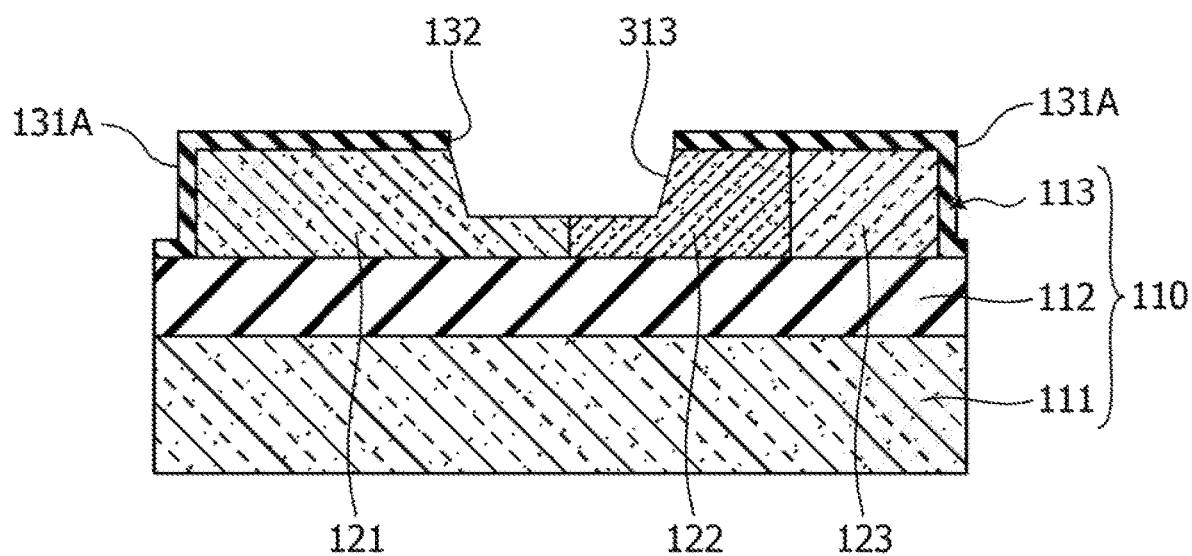
FIG. 21 is a cross-sectional view (No. 1) illustrating a method of manufacturing the optical semiconductor device according to the third embodiment.
Figure 22:
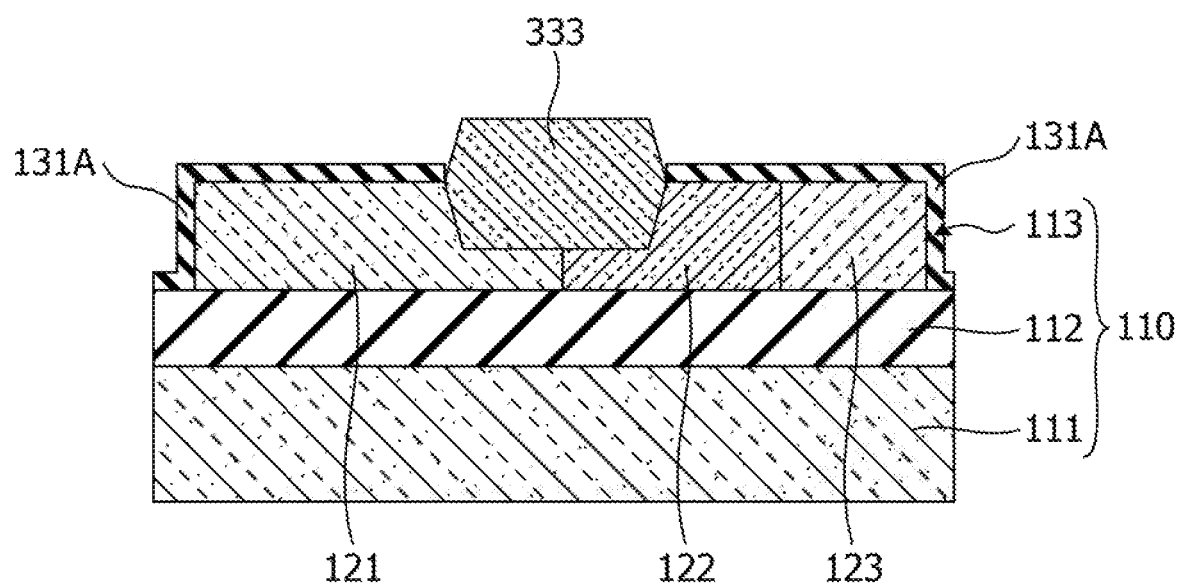
FIG. 22 is a cross-sectional view (No. 2) illustrating the method of manufacturing the optical semiconductor device according to the third embodiment.

A method of manufacturing the optical semiconductor device 300 according to the third embodiment will be described. FIGS. 21 and 22 are cross-sectional views illustrating a method of manufacturing the optical semiconductor device 300 according to the third embodiment.

First, in the same manner as in the first embodiment, the processes up to the formation of the opening portion 132 to the Si oxide film 131A are performed. Next, the photoresist mask 157 is removed (see FIGS. 12A and 12B). Next, as illustrated in FIG. 21, the recess 313 is formed by etching the Si layer 113 by using the Si oxide film 131A as a mask. The recess 313 may be formed by, for example, ICP dry etching.

Subsequently, as illustrated in FIG. 22, the p-type Ge layer 333 is formed over the Si layer 113 so as to fill the recess 313. The p-type Ge layer 333 may be formed by, for example, an LPCVD method, and has a thickness of 150 nm to 250 nm. For example, the p-type Ge layer 333 is heteroepitaxially grown in a mesa shape from the recess 313.

Thereafter, in the same manner as in the first embodiment, the processes after the formation of the Si oxide film 131 are performed. In this manner, the optical semiconductor device 300 according to the third embodiment may be manufactured.

In the manufacturing method according to the third embodiment, the amount of processes is increased by the amount of processes accompanying the formation of the recess 313 as compared with the first embodiment. Meanwhile, in a case where an optical component, which demands formation of a recess in the Si layer 113 such as a grating coupler used for optical input and output to and from an optical fiber, is mounted over the outside of the optical semiconductor device 300, the recess 313 may be formed at the same time as the formation of the grating coupler or the like by changing a mask layout, it is possible to avoid an increase in the number of steps.

In the same manner as in the second embodiment, the Si layer 113 may include the p+ Si region 121A and the p-type Si region 121B. In this case, for example, the recess 313 is formed in the p-type Si region 121B and the i-type Si region 122.

The optical semiconductor device according to the first to third embodiments is suitable for an integrated circuit in which a semiconductor apparatus and an optical semiconductor device which process an electric signal are integrated over an Si substrate, and it is possible to realize high-speed optical communication. For example, it is suitable for high-speed optical communication between a central processing unit (CPU) and a memory of a computer, and high-speed optical communication between the CPUs. It is promising for next-generation large capacity optical interconnect applications.

The materials of the first and second semiconductor layers are not limited to Si and Ge, and for example, an Si layer may be used as the first semiconductor layer, and an $Si_xGe_{1-x}$ layer ($0 \leq x < 1$) or a $Ge_{1-x}Sn_x$ layer ($0 \leq x < 1$) may be used as the second semiconductor layer.

A conductivity type (polarity) of each semiconductor layer and each semiconductor region is not limited to that in the above embodiment. For example, a conductivity type (polarity) opposite to that of the above embodiment may be used.

Fourth Embodiment

Figure 23:
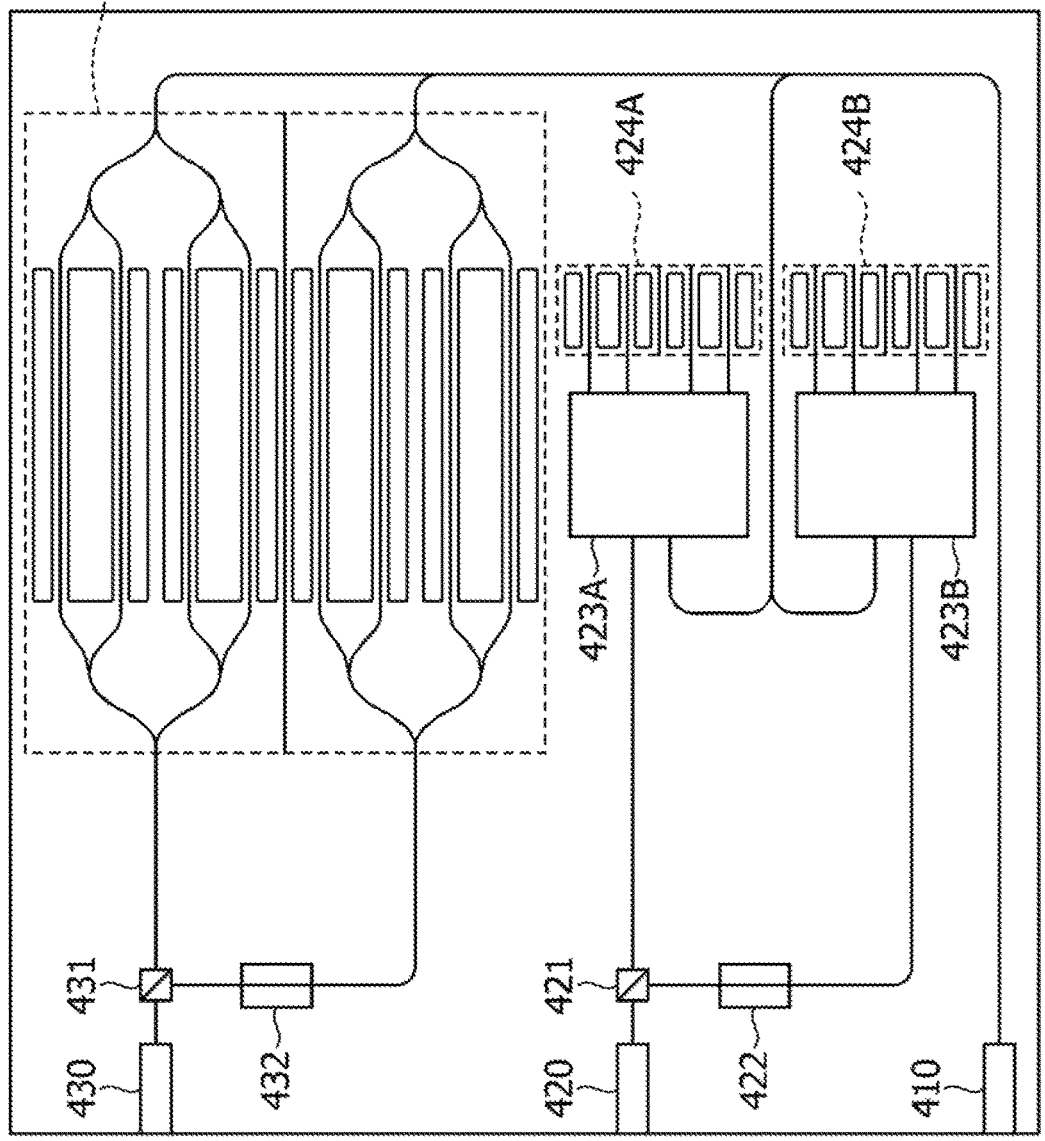
FIG. 23 is a block diagram illustrating a configuration of an optical transmission apparatus according to a fourth embodiment.

Next, a fourth embodiment will be described. The fourth embodiment relates to an optical transmission apparatus including an optical semiconductor device. FIG. 23 is a block diagram illustrating a configuration of an optical transmission apparatus according to the fourth embodiment.

As illustrated in FIG. 23, the optical transmission apparatus according to the fourth embodiment includes an Si photonics coherent integrated device 400. The Si photonics coherent integrated device 400 includes an input portion 410 to which local oscillator light LO is input, an input portion 420 to which signal light SI to be received is input, and an output portion 430 from which signal light SO to be transmitted is output. The input portion may be referred to as an input port and the output portion may be referred to as an output port.

The Si photonics coherent integrated device 400 includes a polarization beam splitter element 421 coupled to the input portion 420, two mixers 423A and 423B coupled to the polarization beam splitter element 421, and a polarization rotator element 422 coupled between the polarization beam splitter element 421 and the mixer. The Si photonics coherent integrated device 400 further includes a light receiver 424A which converts an optical signal output from the mixer 423A into an electric signal, and a light receiver 424B which converts an optical signal output from the mixer 423B into an electric signal. Each of the light receivers 424A and 424B includes a plurality of UTC-PDs each having the same configuration as that of the optical semiconductor device according to any one of the first to third embodiments. The local oscillator light LO input to the input portion 410 is input to the mixers 423A and 423B.

The Si photonics coherent integrated device 400 includes a polarization beam splitter element 431 coupled to the output portion 430, a silicon IQ modulator 433 coupled to the polarization beam splitter element 431, and a polarization rotator element 432 provided in a waveguide of a Q signal output from the silicon IQ modulator 433. The local oscillator light LO input to the input portion 410 is input to the silicon IQ modulator 433.

In the optical transmission apparatus according to the fourth embodiment, since the light receivers 424A and 424B include the UTC-PD having the same configuration as that of the optical semiconductor device according to any one of the first to third embodiments, it is possible to obtain an excellent optical responsivity.

Although the preferred embodiments and the like have been described in detail, the above-described embodiments and the like are not limiting. Various modifications and various types of replacement may be added to the above-described embodiments and the like without departing from the scope of the present disclosure.

All examples and conditional language provided herein are intended for the pedagogical purposes of aiding the reader in understanding the Invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An apparatus comprising:
   a first semiconductor layer including a first bandgap;
   a second semiconductor layer of a first polarity including a second bandgap smaller than the first bandgap, and formed over the first semiconductor layer;
   a first insulation layer in contact with an upper surface of the second semiconductor layer; and
   a second insulation layer in contact with a side surface of the second semiconductor layer,
   wherein the first semiconductor layer includes
   a first conductive region of the first polarity,
   a second conductive region of a second polarity, and
   a non-conductive region between the first conductive region and the second conductive region, the non-conductive region being in contact with the second conductive region.

2. The apparatus of claim 1, further comprising:
   a first metal film in ohmic contact with the first conductive region; and
   a second metal film in ohmic contact with the second conductive region.

3. The apparatus of claim 2,
   wherein the first conductive region includes
   a third conductive region in contact with the first metal film, and
   a fourth conductive region in contact with the non-conductive region, and
   the third conductive region contains a p-type impurity at a concentration higher than a concentration of the fourth conductive region.

4. The apparatus of claim 1,
   wherein a recess is formed in a region of the first semiconductor layer that is in contact with the second semiconductor layer.

5. The apparatus of claim 1, further comprising:
   a photoelectric converter in which the first semiconductor layer and the second semiconductor layer overlap with each other in plan view; and
   a mode converter coupled to the photoelectric converter,
   wherein in the mode converter, the first semiconductor layer has a planar shape of which a width increases as approaching the photoelectric converter.

6. The apparatus of claim 5, wherein the width is a direction perpendicular to an incident direction of the light to the photoelectric converter.

7. The apparatus of claim 1,
   wherein the first polarity is a p-type, and
   the second polarity is an n-type.

8. The apparatus of claim 1,
   wherein the first semiconductor layer is an Si layer, and the second semiconductor layer is a $Si_xGe_{1-x}$ layer ($0 \leq x < 1$).

9. The apparatus of claim 1,
   wherein the first semiconductor layer is an Si layer, and the second semiconductor layer is a $Ge_{1-x}Sn_x$ layer ($0 \leq x < 1$).

10. The apparatus of claim 1, wherein an interface between the second semiconductor layer acts as a diffusion blocking layer for electrons to guide the electrons to the second conductive region.

11. The apparatus of claim 1, wherein a metal film does not contact the second semiconductor layer.

12. The apparatus of claim 1, wherein the second semiconductor layer is in electrical and mechanical contact with a portion of the first semiconductor layer.

13. The apparatus of claim 1, wherein the apparatus is a (Silicon) Si photonic optical semiconductor device.

14. The apparatus of claim 1, wherein the light is introduced into the first polarity region of the second semiconductor, and the photo carrier is generated inside the region.

15. The apparatus of claim 1, wherein the second semiconductor layer contains Boron at a concentration of $0.5 \times 10^{19}$ cm$^{-3}$ to $2.5 \times 10^{19}$ cm$^{-3}$.

16. A (Silicon) Si photonic optical semiconductor device comprising:
    a plurality of light receivers, each of the plurality of light receivers includes a plurality of uni-traveling-carrier photo diodes (UTC-PD), each UTC-PD includes:
    a first semiconductor layer including a first bandgap; and
    a second semiconductor layer of a first polarity including a second bandgap smaller than the first bandgap, and formed over the first semiconductor layer;
    a first insulation layer in contact with an upper surface of the second semiconductor layer; and
    a second insulation layer in contact with a side surface of the second semiconductor layer,
    wherein the first semiconductor layer includes
    a first conductive region of the first polarity,
    a second conductive region of a second polarity, and
    a non-conductive region between the first conductive region and the second conductive region, the non-conductive region being in contact with the second conductive region.

17. A method of manufacturing a (Silicon) Si photonic optical semiconductor device, the method comprising:
    forming a first semiconductor layer including a first bandgap, the first semiconductor layer having a first conductive region of a first polarity, a second conductive region of a second polarity, and a non-conductive region between the first conductive region and the second conductive region, the non-conductive region being in contact with the second conductive region; and
    forming a second semiconductor layer of the first polarity including a second bandgap smaller than the first bandgap, the second semiconductor layer being formed over the first semiconductor layer;

forming a first insulation layer in contact with an upper surface of the second semiconductor layer; and forming a second insulation layer in contact with a side surface of the second semiconductor layer.

\* \* \* \* \*